US012562206B2

(12) United States Patent
Harms et al.

(10) Patent No.: US 12,562,206 B2
(45) Date of Patent: Feb. 24, 2026

(54) METHODS AND APPARATUS FOR DYNAMICALLY ADJUSTING PERFORMANCE OF PARTITIONED MEMORY

(71) Applicant: Micron Technology, Inc., Boise, ID (US)

(72) Inventors: Jonathan D. Harms, Boise, ID (US); David Hulton, Boise, ID (US); Jeremy Chritz, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 82 days.

(21) Appl. No.: 17/867,124

(22) Filed: Jul. 18, 2022

(65) Prior Publication Data

US 2022/0351770 A1 Nov. 3, 2022

Related U.S. Application Data

(63) Continuation of application No. 17/121,466, filed on Dec. 14, 2020, now Pat. No. 11,398,264, which is a
(Continued)

(51) Int. Cl.
*G11C 11/406* (2006.01)
*G06F 11/10* (2006.01)
(Continued)

(52) U.S. Cl.
CPC ........ *G11C 11/406* (2013.01); *G06F 11/1052* (2013.01); *G11C 29/02* (2013.01); *G11C 29/52* (2013.01); *G11C 2211/4062* (2013.01)

(58) Field of Classification Search
CPC ....... G11C 11/406; G11C 29/02; G11C 29/52; G11C 2211/4062; G11C 11/221;
(Continued)

(56) References Cited

U.S. PATENT DOCUMENTS 10,867,655 B1 * 12/2020 Harms .................... G11C 29/52
11,398,264 B2 * 7/2022 Harms ................ G11C 29/028
(Continued)

FOREIGN PATENT DOCUMENTS

CN 104981876 A * 10/2015 ......... G11C 13/0004
CN 104981876 B * 2/2019 ......... G11C 13/0004

OTHER PUBLICATIONS

For (Year: 2015).*
U.S. Appl. No. 17/121,466, filed Dec. 14, 2020, Jonathan Harms, et al.

*Primary Examiner* — Fernando Hidalgo
(74) *Attorney, Agent, or Firm* — Greenberg Traurig

(57) ABSTRACT

Methods and apparatus for dynamically adjusting performance of partitioned memory. In one embodiment, the method includes receiving one or more configuration requests for the memory device, determining whether to grant the one or more configuration requests for the memory device, in response to the determining, implementing the one or more configuration requests within the memory device and operating the memory device in accordance with the implementing. The adjusting of the performance for the partitioned memory includes one or more of enabling/disabling refresh operations, altering a refresh rate for the partitioned memory, enabling/disabling error correcting code (ECC) circuitry for the partitioned memory, and/or altering a memory cell architecture for the partitioned memory. Systems and applications that may benefit from the dynamic adjustment of performance are also disclosed.

20 Claims, 13 Drawing Sheets

Related U.S. Application Data continuation of application No. 16/505,472, filed on Jul. 8, 2019, now Pat. No. 10,867,655.

(51) Int. Cl.

*G11C 29/02*       (2006.01)

*G11C 29/52*       (2006.01)

(58) Field of Classification Search

CPC ............ G11C 11/2273; G11C 13/0033; G11C 16/3418; G11C 7/04; G11C 29/023; G11C 2029/0407; G11C 29/028; G11C 11/40618; G11C 8/12; G11C 11/40622; G11C 11/40626; G11C 29/42; G11C 29/70; G11C 2029/0411; G11C 11/408; G06F 11/1052; G06F 11/1048

USPC .......................................................... 365/222

See application file for complete search history.

(56) References Cited

U.S. PATENT DOCUMENTS

| | | |
|---|---|---|
| 2011/0004805 A1 | 1/2011 | Seo |
| 2011/0202813 A1* | 8/2011 | Resnick ............. G06F 11/2094 |
| | | 714/763 |
| 2012/0099389 A1 | 4/2012 | Park et al. |
| 2013/0003451 A1 | 1/2013 | Bedeschi et al. |
| 2017/0308328 A1 | 10/2017 | Lim et al. |
| 2020/0350032 A1* | 11/2020 | Saillet ................... G11C 29/52 |
| 2021/0098047 A1 | 4/2021 | Harms et al. |

* cited by examiner

1000 start

→ receive configuration request for a memory device    1002

→ grant configuration request?    1004

— grant → implement configuration in memory device    1006

→ operate memory device in accordance with configuration    1010

→

Continue deny → re-submit configuration request?    1008 yes → no →

METHODS AND APPARATUS FOR DYNAMICALLY ADJUSTING PERFORMANCE OF PARTITIONED MEMORY

PRIORITY

This application is a continuation of, and claims priority to, co-owned and co-pending U.S. patent application Ser. No. 17/121,466 filed Dec. 14, 2020, entitled "METHODS AND APPARATUS FOR DYNAMICALLY ADJUSTING PERFORMANCE OF PARTITIONED MEMORY" and issuing on Jul. 26, 2022 as U.S. Pat. No. 11,398,264, which is a continuation of, and claims priority to, co-owned U.S. patent application Ser. No. 16/505,472 filed Jul. 8, 2019, of the same title, and issued as U.S. Pat. No. 10,867,655 on Dec. 15, 2020, each of which are incorporated herein by reference in its entirety.

COPYRIGHT

BACKGROUND

1. Technological Field

The present disclosure relates generally to semiconductor memory devices and more specifically in one exemplary aspect to dynamically adjusting performance in memory devices such as, for example, volatile memory devices (e.g., dynamic random-access memory (DRAM)) and non-volatile memory devices (e.g., flash memory).

2. Description of Related Technology

Memory devices are widely used to store information in various electronic devices such as computers, wireless communication devices, cameras, digital displays, and the like. Information is stored by programing different states of a memory device. For example, binary devices have two states, often denoted by a logical "1" or a logical "0." To access the stored information, the memory device may read (or sense) the stored state in the memory device. To store information, the memory device may write (or program) the state in the memory device. So-called volatile memory devices may require power to maintain this stored information, while non-volatile memory devices may persistently store information even after the memory device itself has, for example, been power cycled.

Volatile memory devices, such as DRAM devices, may need to periodically refresh its memory contents in order to preserve the information stored therein. Memory refresh is typically a background maintenance process that is required during the operation of the memory device. For example, in a DRAM device, each bit of information is stored as either the presence or absence of an electric charge on a small capacitor located on the semiconductor device. As time passes, the charges in these memory cells begin to dissipate such that if their contents are not "refreshed", the information stored thereon would eventually be lost. In order to prevent this loss of information, circuitry is required that needs to periodically read each cell and rewrite it, thereby restoring the charge on a given memory cell to its original level. This refresh process is typically conducted automatically in the background by the memory circuitry and is otherwise transparent to the user. However, during a refresh cycle, the memory device is not available for normal read and write operations. These periodic refresh cycles introduce, inter alia, additional processing overhead, thereby diminishing memory device throughput.

Additionally, so-called error-correcting code (ECC) memory is often implemented in conjunction with these memory devices. ECC-enabled memory is used to detect and correct a variety of types of internal data corruption that may occur. For example, electrical and/or magnetic interference may cause single bit errors within a semiconductor device such as a DRAM. These corruptions may be resultant from background radiation (e.g., neutrons from cosmic rays) which may cause a memory cell within, for example, a DRAM device to spontaneously flip to an opposite state. While ECC-enabled memory is useful in correcting these single bit errors, the error correcting nature of ECC-enabled memory is not without its drawbacks. ECC-enabled memory devices usually involve a higher cost for end consumers as compared with non-ECC memory due to the additional hardware required for producing these ECC-enabled memory devices. Additionally, motherboards, chipsets, and processors that support ECC may also be more expensive, thereby driving up the cost for the system. ECC memory may also result in lower memory performance due to the additional processing time required for ECC memory controllers to perform error checking (e.g., 2-3 percent).

Memory device performance is typically governed by standard setting organizations, such as the Joint Electron Device Engineering Council (JEDEC). Most memory devices are tested to ensure memory interoperability across a wide swathe of memory-intensive applications. For example, the traditional or "general compute" memory assumes that error rates should be virtually non-existent (e.g., bit error rates (BER) on the order of $1\times10^{18}$). However, not all applications require this level of performance, and compliance with JEDEC standards may not be optimized for power consumption and memory processing throughput for such applications.

Although advancement in various memory technologies, such as the aforementioned refresh and ECC, has resulted in highly reliable memory devices; these memory technologies may prove sub-optimal for certain types of memory device applications. Accordingly, memory technologies are needed that offer increased design flexibility over prior memory technologies that operate according to, for example, the aforementioned JEDEC standards.

SUMMARY

The present disclosure addresses the foregoing needs by providing, inter alia, methods and apparatus for dynamic adjustment of performance of partitioned memory.

In one aspect, a method for operating a memory device is disclosed. In one embodiment, the method includes: receiving one or more configuration requests for the memory device; determining whether to grant the one or more configuration requests for the memory device; in response to the determining, implementing the one or more configuration requests within the memory device; and operating the memory device in accordance with the implementing.

In one variant, the receiving the one or more configuration requests includes receiving a request to alter refresh operations for a portion of the memory device.

In another variant, the receiving of the request to alter the refresh operations for the portion of the memory device includes receiving a request to lower a refresh rate for the portion of the memory device.

In yet another variant, the receiving of the request to alter the refresh operations for the portion of the memory device includes receiving a request to increase a refresh rate for the portion of the memory device.

In yet another variant, the receiving of the request to alter the refresh operations for the portion of the memory device includes receiving a request to disable refresh for the portion of the memory device.

In yet another variant, the receiving the one or more configuration requests includes receiving a request to disable error correcting code circuitry for a portion of the memory device.

In yet another variant, the receiving the one or more configuration requests includes receiving a request to alter a memory cell architecture for at least a portion of the memory device.

In another aspect, a memory device is disclosed. In one embodiment, the memory device is configured to at least partly implement at least a portion of the one or more aspects disclosed elsewhere herein.

In yet another aspect, a memory array is disclosed. In one embodiment, the memory array is configured to receive one or more configuration requests, the one or more configuration requests enabling an alteration of a memory cell architecture for the memory array.

In yet another aspect, a computing device is disclosed. In one embodiment, the computing device includes a processing apparatus; a memory device in communication with the processing apparatus; and a non-transitory computer readable apparatus having a storage medium that includes a plurality of computer-readable instructions, the plurality of computer-readable instructions, when executed by the processing apparatus, being configured to: receive one or more configuration requests for the memory device from an application resident on the computing device; determine whether to grant the one or more configuration requests from the application; in response to the determination, implement the one or more configuration requests within the memory device; and operate the memory device in accordance with the implementation of the one or more configuration requests.

In one variant, the determination of whether to grant the one or more configuration requests from the application includes a determination of whether the application is a trusted application.

In another variant, the determination of whether to grant the one or more configuration requests from the application includes a determination of whether the one or more configuration requests received conflicts with a previously received configuration request.

In yet another variant, the determination of whether to grant the one or more configuration requests from the application includes a determination of a priority level for the application.

In yet another variant, the implementation of the one or more configuration requests includes a write to a configuration register of the memory device, the write to the configuration register enabling the implementation.

In yet another variant, the operation of the memory device in accordance with the implementation of the one or more configuration requests enables a conservation of power resources for the computing device as compared with operation of the memory device without the implementation of the one or more configuration requests.

In yet another aspect, an integrated circuit (IC) is disclosed. In one embodiment, the IC is configured to: receive one or more configuration requests for a memory device; implement the one or more configuration requests within the memory device, the implementation comprising an alteration of one or more performance characteristics of the memory device; and operate the memory device in accordance with the implementation.

In one variant, the alteration of the one or more performance characteristics includes alteration of refresh operations for a portion of the memory device.

In another variant, the alteration of the refresh operations for the portion of the memory device includes a reduction in refresh rate for the portion of the memory device.

In yet another variant, the alteration of the refresh operations for the portion of the memory device includes an increase in refresh rate for the portion of the memory device.

In yet another variant, the alteration of the refresh operations for the portion of the memory device includes a disabling of refresh operations for the portion of the memory device.

In yet another variant, the alteration of the one or more performance characteristics includes a disabling of error correcting code circuitry for a portion of the memory device.

In yet another variant, the alteration of the one or more performance characteristics includes an alteration of a memory cell architecture for at least a portion of the memory device.

In yet a further aspect, a method of operating a memory device is disclosed, In one embodiment, the method includes: providing access to a first portion of the memory device through a first address range; implementing one or more configuration changes within the memory device; and based at least on the one or more configuration changes, providing access to the first portion and a second portion of the memory device through a second address range.

In one variant of the method, the providing access to the first portion of the memory device through a first address range, and the providing access to the first portion and the second portion of the memory device through a second address range, are each performed during a normal operation state of a host computerized device within which the memory device is integrated.

In another variant, the one or more configuration changes include disabling an ECC (error-correcting code) function of the memory device, and the second address range includes an address range having one (1) more bit than the first address range.

In yet another aspect of the disclosure, a computer readable apparatus is described. In one embodiment, the computer readable apparatus includes a storage medium having a plurality of computer-readable instructions, the plurality of computer-readable instructions, when executed by a processing apparatus, being configured to: receive one or more configuration requests for a memory device; implement the one or more configuration requests within the memory device, the implementation comprising an alteration of one or more performance characteristics of the memory device; and operate the memory device in accordance with the implementation.

In one variant, the alteration of the one or more performance characteristics includes alteration of refresh operations for a portion of the memory device.

In another variant, the alteration of the refresh operations for the portion of the memory device includes a reduction in refresh rate for the portion of the memory device. In yet another variant, the alteration of the refresh operations for the portion of the memory device includes an increase in refresh rate for the portion of the memory device.

In yet another variant, the alteration of the refresh operations for the portion of the memory device includes a disabling of refresh operations for the portion of the memory device.

In yet another variant, the alteration of the one or more performance characteristics includes a disabling of error correcting code circuitry for a portion of the memory device.

In yet another variant, the alteration of the one or more performance characteristics includes an alteration of a memory cell architecture for at least a portion of the memory device.

In yet another aspect, a system architecture that enables any one of the foregoing aspects is disclosed. In one embodiment, the system architecture is configured for video buffering applications.

In another embodiment, the system architecture is configured for Internet of Things (IoT) applications.

In yet another embodiment, the system architecture is configured for use in fog networking applications.

These and other aspects shall become apparent when considered in light of the disclosure provided herein.

DETAILED DESCRIPTION

Figure 1:
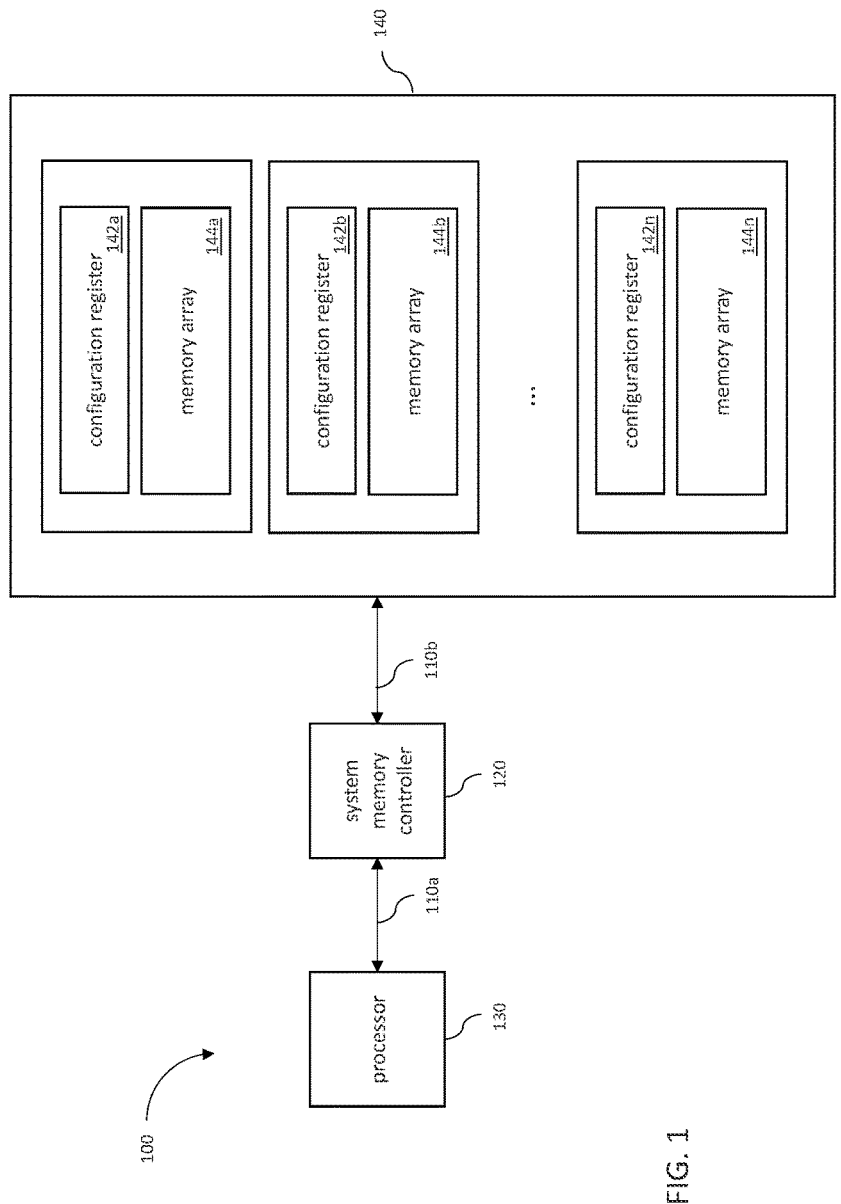
FIG. 1 is a logical block diagram illustrating an exemplary architecture for a memory system that includes partitioned memory arrays, in accordance with the principles of the present disclosure.

Reference is now made to the drawings wherein like numerals refer to like parts throughout.

As used herein, the term "computer program" or "software" is meant to include any sequence of human or machine cognizable steps which perform a function. Such program may be rendered in virtually any programming language or environment including, for example, C/C++, Fortran, COBOL, PASCAL, Python, Ruby, assembly language, markup languages (e.g., HTML, SGML, XML, VoXML), and the like, as well as object-oriented environments such as the Common Object Request Broker Architecture (CORBA), Java™ (including J2ME, Java Beans, etc.) and the like, and may also include scripts, including without limitation those written in scripting languages.

As used herein, the terms "memory" or "memory device" may include any type of integrated circuit or other storage device adapted for storing digital data including, without limitation, ROM, PROM, EEPROM, DRAM, SDRAM, DDR/2 SDRAM, DDR/3 SDRAM, DDR/4 SDRAM, GDDRx, EDO/FPMS, FeRAM, ReRAM, RLDRAM, SRAM, "flash" memory (e.g., NAND/NOR), 3D memory, and PSRAM.

As used herein, the terms "microprocessor", "processor" or "digital processor" are meant generally to include all types of digital processing devices including, without limitation, digital signal processors (DSPs), reduced instruction set computers (RISC), general-purpose (CISC) processors, microprocessors, gate arrays (e.g., FPGAs), PLDs, reconfigurable computer fabrics (RCFs), array processors, secure microprocessors, and application-specific integrated circuits (ASICs). Such digital processors may be contained on a single unitary IC die, or distributed across multiple components.

Overview

In one exemplary aspect, the present disclosure provides for improved methods and apparatus for the dynamic adjustment of performance for partitioned memory devices. In an exemplary embodiment, a memory device is optimized for a given application such that the memory bandwidth is improved and/or power consumption is minimized as compared with prior inflexible memory architectures.

Embodiments are disclosed herein which enable an application or operating system (OS) to flexibly alter a memory device's configuration during application runtime so as to further optimize its operation, especially in instances in which the memory requirements may change over time. In one exemplary approach of the present disclosure, memory devices are disclosed which may disable or enable memory refresh operations. For example, in applications where the data stored within the memory device may be expected to be stored and consumed within a prescribed period of time (e.g., in video buffering applications), the memory device may disable memory refresh operations so as to maximize memory throughput and minimize power consumption by the memory device. Other portions of the same memory device may enable memory refresh operations where the data stored within these other portions of the memory device are required to be preserved. Yet other applications may be tolerant to higher bit error rates associated with memory storage and hence, the memory refresh rates may be adjusted so as to occur less frequently. In another exemplary approach, the memory device may be further configured so as to enable or disable error correcting code (ECC) circuitry. Other implementations may allow for the alteration of the memory cell architectures themselves, within the underlying memory device.

Combinations of the foregoing techniques are also disclosed which may be employed so as to further enhance the design flexibility for the underlying memory device. For example, the various techniques described herein may be specifically tailored for a given application and a memory device's operating characteristics may be altered when another application is invoked. Specific operating examples are also disclosed in which these memory devices may be more suitable than prior memory device architectures. For example, specific operating examples are given in the context of video buffering applications, Internet of Things (IoT) applications, and fog networking implementations. Advantageously, some exemplary embodiments of the methods and apparatus consume less power; thereby facilitating implementation within power constrained, or otherwise power sensitive, computing devices.

Advantageously, the various aspects may be utilized in either or both normal operational conditions of the memory device(s) (e.g., when installed and operated in a host device), and during testing operations (whether the memory device is integrated within the host or not).

Other features and advantages of the present disclosure will immediately be recognized by persons of ordinary skill in the art with reference to the attached drawings and detailed description of exemplary embodiments as given below.

Detailed Description of Exemplary Embodiments

Exemplary embodiments of the apparatus and methods of the present disclosure are now described in detail. While these exemplary embodiments are primarily described in the context of volatile memory devices (such as the aforementioned DRAM and static random-access memory (SRAM) devices), the general principles and advantages of the disclosure may be extended to other types of integrated circuit memory devices including, without limitation, non-volatile memory devices such as, without limitation, flash memory, non-volatile random-access memory (NVRAM), resistive random-access memory (ReRAM), ferroelectric random-access memory (FeRAM), magnetoresistive random-access memory (MRAM) and the like, the following therefore being merely exemplary in nature.

It will be further appreciated that while certain steps and aspects of the various methods and apparatus described herein may be performed by a human being, the disclosed aspects and individual methods and apparatus are generally computerized/computer-implemented. Computerized apparatus and methods are necessary to fully implement these aspects for any number of reasons including, without limitation, commercial viability, practicality, and even feasibility (i.e., certain steps/processes simply cannot be performed by a human being in any viable fashion). Other features and advantages of the present disclosure will immediately be recognized by persons of ordinary skill in the art with reference to the attached drawings and detailed description of exemplary embodiments as given below.

Exemplary System Apparatus/Architecture—

FIG. 1 is a logical block diagram illustrating an exemplary architecture for a system 100 that includes partitioned memory arrays 144 in accordance with the principles of the present disclosure. The system 100 may include a processor 130 (e.g., a microprocessor, digital processor, etc.) that is coupled with a memory device 140 via, for example, a communications interface 110. The communications interface 110 may include any number of suitable computing bus architectures such as, for example, system bus architectures or even any number of input/output (I/O) bus architectures which are commonly used to connect various peripheral devices to one or more processors.

In some implementations, a system memory controller 120 may assist in communications between the processor 130 and the memory device 140 (as shown). In other implementations, system memory controller functionality is subsumed within either the processor 130 or the memory 140. In FIG. 1, the processor 130 is coupled to the system memory controller 120 via communications interface 110a, while the system memory controller 120 is coupled to the memory device 140 via communications interface 110b.

The system memory controller 120 may include a digital circuit that manages the flow of data going between the processor 130 and the memory device 140. In other words, the system memory controller 120 may assist in managing the flow of data going to/from respective ones of the memory arrays 144. For example, the system memory controller 120 may include firmware (e.g., a memory driver) that allows applications running on the processor 130 to communicate with the memory device 140 regardless of the memory technology.

As a brief aside, memory controllers include the technology specific logic necessary to connect to a memory device. For example, a DRAM memory controller will convert a memory access (e.g., a memory-mapped input/output (MMIO) address) into row and column addressing that is specific to the DRAM memory. Also, DRAM memory quickly loses its capacitive charge. Thus, a DRAM memory controller may also perform the required refreshing to ensure that data remains valid (i.e., such that a primary processor doesn't need to refresh the DRAM). In another such example, a flash memory controller will convert a MMIO access into the appropriate erase-before-write instructions that are specific to the flash memory. Flash memory may also require uniform "wear-leveling" to prolong flash memory life; consequently, a flash memory controller may periodically move data contents to different physical memory locations (that use the same logical MMIO address). Artisans of ordinary skill in the related arts will readily appreciate that virtually all memory technologies have different interface requirements; the memory controller 120 can present a common interface to the processor 130 so as to abstract and offload memory technology idiosyncrasies from the processor 130.

Referring back to FIG. 1, the memory device 140 may be partitioned into a plurality of memory arrays (144a, 144b . . . 144n). In one exemplary embodiment of the present disclosure, individual ones of these memory arrays may be operated independently from other ones of the other memory arrays. For example, a first memory array may be operated independently from a second memory array. In some implementations, this independent operation may be characterized by differing operating parameters. In one such variant, memory array may operate as a memory array having a first refresh rate, while other memory arrays may have a different refresh rate. Further, auto-refresh and self-refresh operations may be modified to have different looping structures. In one implementation, a first refresh loop may include the entire address space of a memory chip and a second refresh loop may include only part of the address space of the memory chip. In another implementation, a first refresh loop may range over one portion of the address space of a memory chip and a second refresh loop may range over a different portion of the address space.

Other common examples of operational parameters may include e.g., memory cell operation (e.g., single ended versus differential), error correction, power, clocking, word-size, etc.

As used herein, the term "independent" refers to a memory device having memory arrays isolating one or more of the clock domain, power domain, refresh circuitry, error correction circuitry, configuration registers, and/or memory cells. An independent memory array is isolated so as to allow a processor to access the array differently from other memory arrays in the memory device.

The various memory arrays 144 illustrated in FIG. 1 may further include one or more configuration registers 142— implemented using static random-access memory (SRAM)— associated with the memory arrays 144. These individual configuration registers 142 may be associated with e.g., (i) a corresponding respective memory array 144, (ii) the memory arrays 144 as a whole, and/or (ii) one or more subset(s) of the memory arrays 144. In some implementations, these configuration registers 142 may be used to reconfigure individual ones of the memory arrays 144. For example, some values for a given configuration register 142a (or a given number of configuration registers) may be associated with memory array 144a. Dependent upon the value loaded into the configuration register(s), the behavior of memory array 144a may change. In one such exemplary embodiment, one configuration register value may turn off refresh for memory array 144a, another value may turn on refresh for memory array 144a at a first refresh rate, yet another value may turn on refresh for memory array 144a at a second refresh rate that occurs more frequently than the first refresh rate, and so on and so forth.

In alternative embodiments, the plurality of memory arrays may be statically set or "hardened" with a set of operational parameters. For instance, a first memory array may have a preset first refresh rate, and a second memory array may have a second preset refresh rate. In some such cases, the memory arrays may be structurally configured to only support the hardened parameters. In other such cases, the memory arrays include configuration registers that are "fused" during manufacture and cannot be subsequently changed.

Figure 1B:
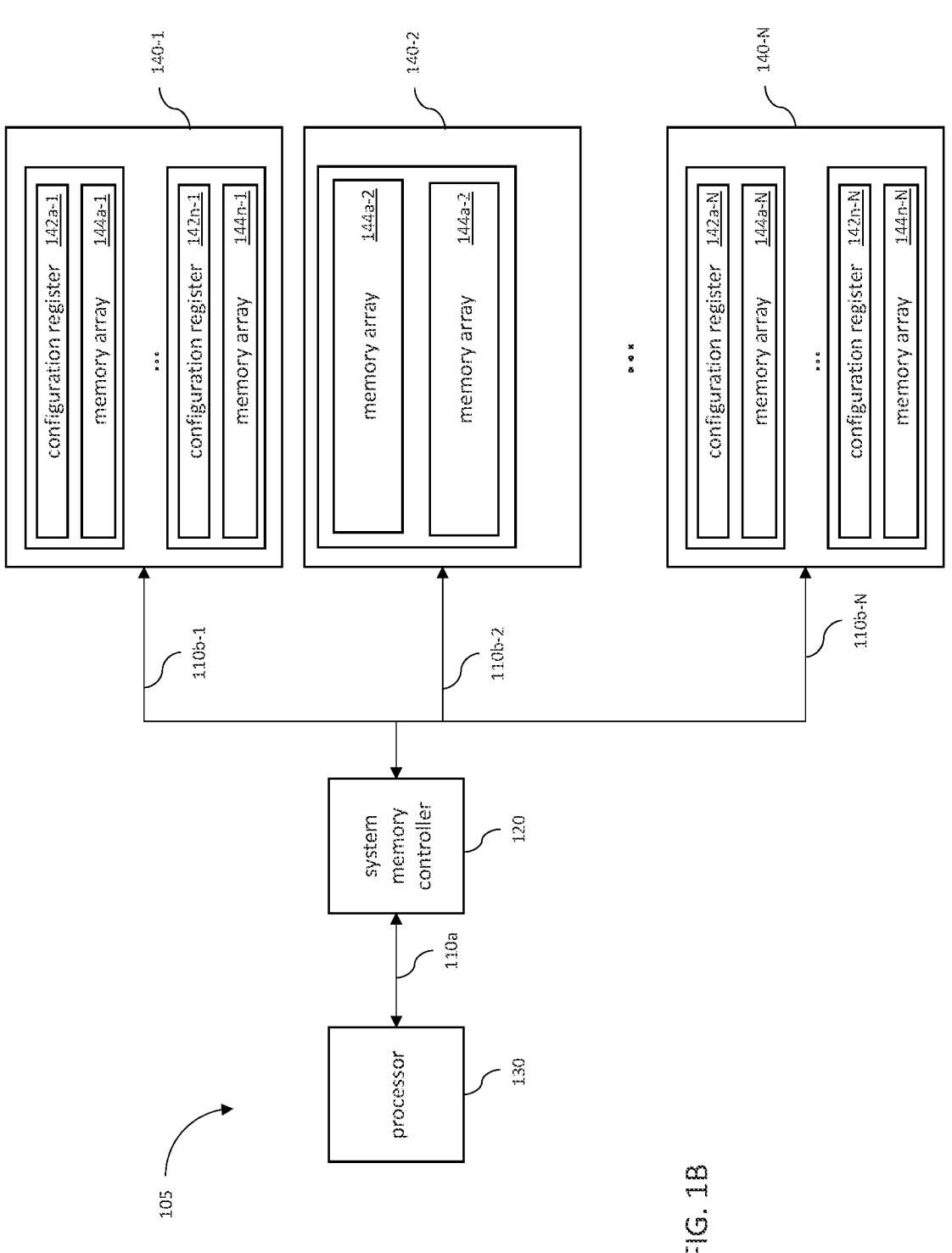
FIG. 1B is a functional block diagram illustrating an exemplary architecture for a memory system that includes multiple memory chips, in accordance with the principles of the present disclosure.

As used herein, the term "hardened" in the context of semiconductor devices refers to parameters that are fixed at the time of memory device manufacture. Examples of hardening include e.g., inflexible circuit design, destructive programming (e.g., burning fuses which cannot be unburnt), and/or other permanent manufacture techniques. FIG. 1B is a functional block diagram illustrating exemplary architecture for a system 105 that includes multiple memory ICs or chips 140 (140-1 . . . 140-N), in accordance with the principles of the present disclosure. The system 105 may include a processor 130 that is coupled to multiple memory chips 140 via, for example, a communications interface 110. A system controller 120 may assist in communications between the processor 130 and the memory devices 140. In other implementations, system memory controller function-ality is subsumed within either the processor 130 or the memory devices 140. In FIG. 1A, the system memory controller 120 is coupled to multiple memory devices 140-1 . . . 140-N via respective communications interfaces 110b-1 . . . 110b-N. In some embodiments, individual memory controllers are coupled to individual memory devices.

Individual memory chips 140 may be partitioned into pluralities of memory arrays (144a . . . 144n) or have only a single memory array. In the example of FIG. 1B, memory chip 140-1 is partitioned into a plurality of memory arrays (144a-1 . . . 144a-N) while memory chip 140-2 contains only a single memory array 144a-2. The above example is only illustrative, and various configurations of different types of memory chips may be used within the system architecture 105. In one implementation, all memory devices 140 are partitioned into pluralities of memory arrays. Refer-ring back to FIG. 1B, in some embodiments, the individual memory chips 140 may be operated independently from other memory chips 140. In one variation, a memory con-troller 130 can dictate that individual memory chips 140 of the same type (e.g., all DRAM) be operated at different refresh intervals.

Individual memory arrays within a memory chip may be operated independently from other memory arrays within the same memory chip. In some embodiments, some of the memory arrays within the same chip may be coupled together (e.g., have the same refresh rate, error correlation, clocking, etc.). In various embodiments, some memory arrays within different chips may be coupled together.

Similar to the system 100 (FIG. 1), the various memory arrays 144 illustrated in FIG. 1B may include one or more configuration registers 142 associated with the memory arrays 144.

Figure 2:
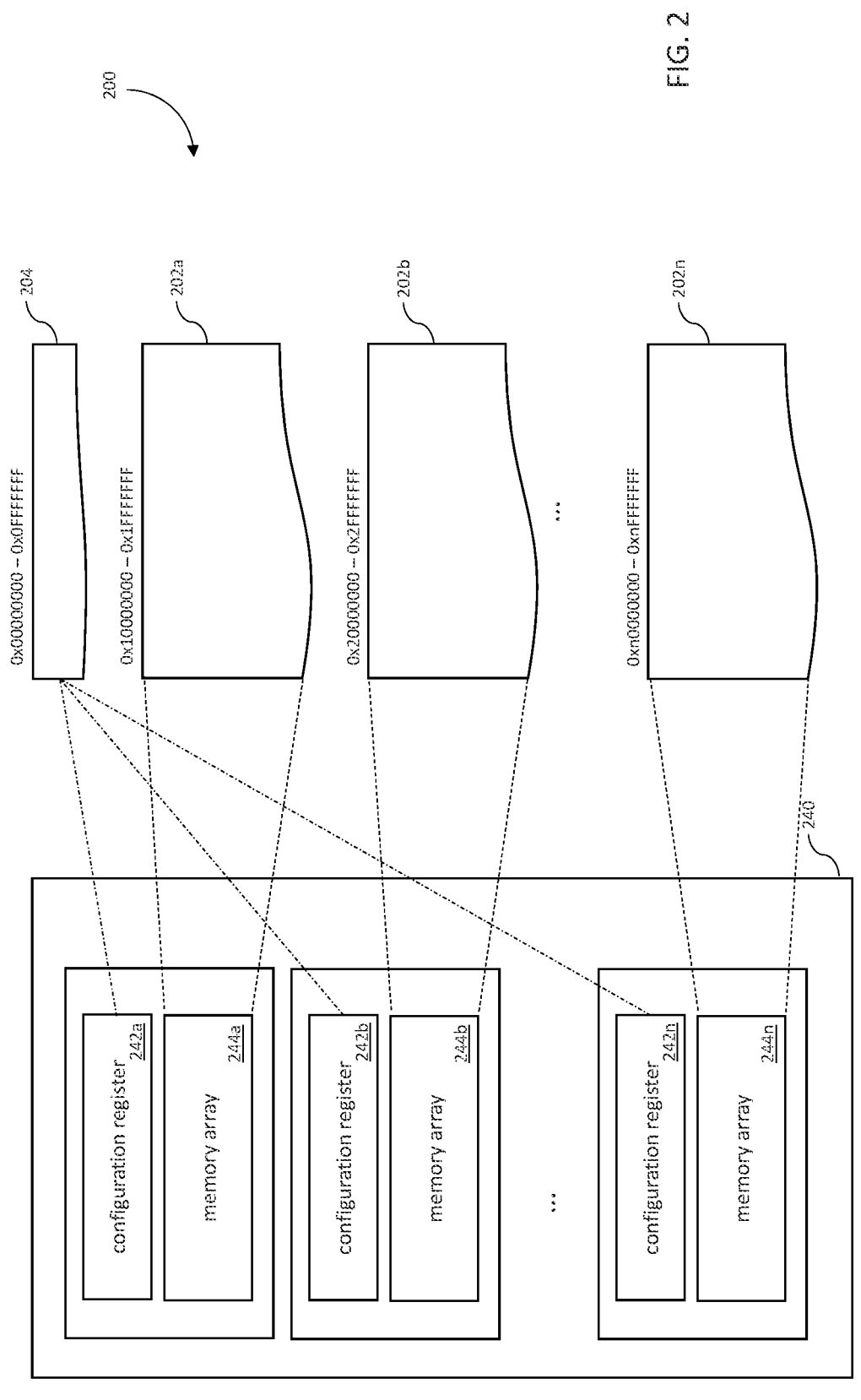
FIG. 2 is a logical memory map corresponding to an exemplary memory device, in accordance with the principles of the present disclosure.

FIG. 2 illustrates one logical memory map 200 corre-sponding to an exemplary memory device. The memory arrays 244 of the memory device 240 are mapped to linear spaces of a memory-mapped I/O (MMIO). During normal operation, software applications that access locations within the MMIO, directly access memory locations within the memory device 240. Specifically, the MMIO is created by an operating system (OS) to represent the span of accessible space.

Each of the memory arrays 244 may be fixed in size and addressing range. For example, memory array 242a is mapped to the memory address space 202a (0x10000000-0x1FFFFFFF); memory array 242b is mapped to the memory address space 202b (0x20000000-0x2F FFFFFF); . . . memory array 242n is mapped to the memory address space 202n (0xn0000000-0xnFFFFFFF).

In some implementations, a given memory array 244 (e.g., memory array 244a) may be dynamically configured via its corresponding configuration register 242 (e.g., con-figuration register 242a). In some such variants, the con-figuration registers may be addressed via out-of-band com-munication (e.g., a dedicated device bus, etc.). For example, the configuration registers may be programmed via a special mode setting that is accessed via pin configurations not normally used during operation. In other variants, the con-figuration registers may be appended to or concatenated with the memory array space. Referring to FIG. 2, in yet other variants, a configuration register space 204 is included as part of the MMIO (e.g., 0x00000000-0x0FFFFFFF). In this manner, the processor can directly read from and/or write to the configuration registers 242a, 242b, 242n during opera-tion. Still other variants for configuring memory may be substituted by artisans of ordinary skill given the contents of the present disclosure.

While the present discussion is presented within the context of a particular memory allocation scheme, other schemes may be substituted with equivalent success. For example, port-mapped I/O (PMIO) is described in greater detail hereinafter. Various operating parameters and their corresponding effects on operation are described in greater detail hereinafter.

Configurable Refresh Rates—

As previously noted, Dynamic Random Access Memory (DRAM) is a type of random access memory that stores data in a capacitor within an integrated circuit. Each bit of information may be stored as either the presence or absence of an electric charge on the capacitor located within the memory device. As time passes in a volatile memory array, the charges in these memory cells begin to dissipate; over a long enough interval (e.g., 60 milliseconds (ms)) the stored information is lost. In order to ensure that the DRAM contents remain valid for longer times, "refresh" circuitry periodically reads each cell and rewrites it, thereby restoring the charge on a given memory cell (e.g., a capacitor) to its original level.

Capacitive discharge is a physical property of each memory cell's capacitor, and due to manufacturing tolerances some memory cells may have longer discharge times than others. For practical purposes, a DRAM will progressively accumulate bit errors over time if the refresh interval is too long. Within the context of the general compute paradigm, reliability is measured as bit error rate (BER). Thus, higher reliability memory may be characterized by more frequent refreshes of memory (e.g., every 60 ms), while lower reliability memory may be characterized by less frequent or no refreshes of volatile memory.

However, the general compute paradigm ignores the underlying physical memory mechanism of DRAM storage; in other words, reliability is a function of time between refreshes for DRAM. Certain types of applications use DRAM memory for very short storage times (sub-60 ms). For example, standard cinematic video is shot at 24 frames/second; i.e., every video frame has a lifetime of ~42 ms. Thus, the data in a video frame has a shorter lifetime than DRAM memory cell refresh. As a result, DRAM memory could be used without refresh with no adverse effect on video applications. In other words, video frame data stored on DRAM is used before the DRAM capacitors lose their charge.

Additionally, some applications can tolerate higher BER. Error-tolerant computing (also sometimes referred to as "error-resilient") refers to computing which assumes and allows for the presence of some noise and/or errors in memory and/or data. There are many applications for probabilistic computing, stochastic computing, and/or other types of error-tolerant computing.

Referring back to FIG. 1, exemplary embodiments of the present disclosure enable different memory arrays 144 contained within memory device 140 to operate differently. For example, a first memory array 144a may be compliant with a standard (e.g., JEDEC JESD79-4B DDR4), while a second memory array 144b may not be compliant with a standard. In other words, memory array 144a may be treated as a higher reliability memory over periods of time greater than 60 ms, while memory array 144b may be treated as a relatively lower reliability memory for periods of time greater than 60 ms or alternatively may be used within the 60 ms time frame without any reliability degradation. Even though a refresh cycle does not directly affect processor 130 performance, refreshing the memory 140 consumes memory access bandwidth and system memory controller 120 processing cycles. Thus reducing the refresh burden can indirectly improve overall system performance. In this manner, a single memory component can be tailored to optimize memory performance based on application requirements.

Figure 3:
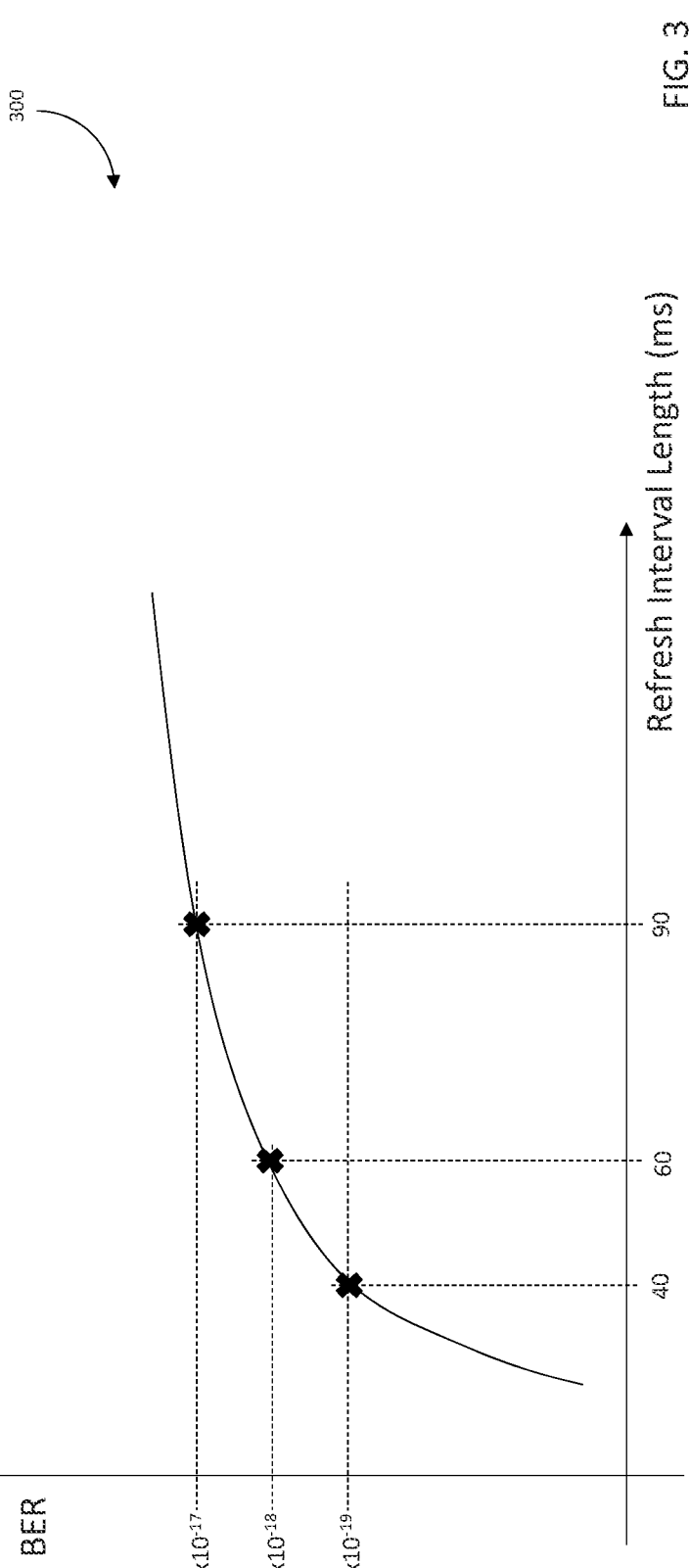
FIG. 3 is a graphical plot of raw bit error rate (BER) as a function of refresh interval, useful for illustrating various aspects of the present disclosure.

In addition to higher and lower reliability over periods of time, some implementations may introduce various gradations of reliability operation (e.g., refreshing on time scales that are longer than 60 ms, and mitigating the resulting data loss). FIG. 3 illustrates is a graphical representation of one illustrative plot 300 of raw bit error rate (BER) as a function of refresh interval. An application can intelligently use the memory performance characteristics to select a refresh rate that both minimizes memory bandwidth for refresh while still providing acceptable reliability. For example, a first memory array may use a refresh rate (e.g., 60 ms) that results in low bit error rates (e.g., $1 \times 10^{18}$) for the first memory array; however, a second memory array may use a refresh rate (e.g., 90 ms) that results in a slightly higher bit error rate than the first memory array (e.g., $1 \times 10^{17}$).

While the foregoing example is presented in the context of DRAM refresh, artisans of ordinary skill in the related arts will readily appreciate that most dynamic memory technologies may be selectively modified to increase or decrease volatility (BER as a function of time) so as to trade-off other memory performances. These and other variations would be readily apparent to one of ordinary skill given the contents of the present disclosure, the foregoing merely being exemplary.

Configurable Cell Architecture—

Figure 4:
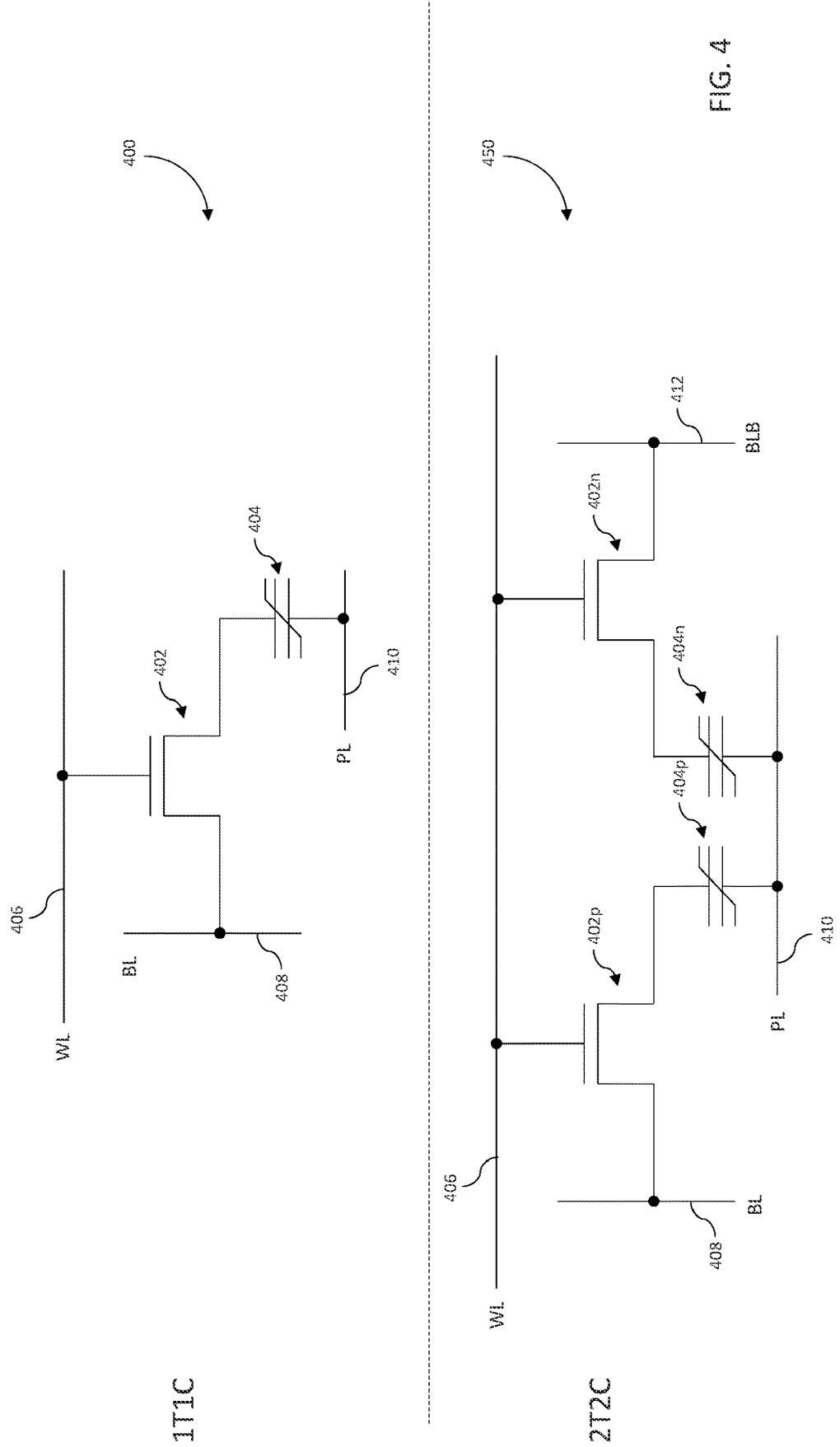
FIG. 4 is a graphical representation of exemplary memory cell circuitries, useful for illustrating various aspects of the present disclosure.

Existing DRAM memory cells (and other memory technologies e.g., Ferroelectric Random Access Memory (FRAM)) are classified into two distinct types: one transistor one capacitor (1T1C), and two transistor two capacitor (2T2C). FIG. 4 is a graphical illustration of one exemplary 1T1C memory cell 400 and one exemplary 2T2C memory cell 450.

As illustrated in FIG. 4, a 1T1C memory cell 400 is composed of one transistor 402 that is coupled in to one capacitor 404. During a write operation, the word line (WL) 406 is asserted and the bit value is asserted on the bit line (BL) 408 (e.g., logic low, logic high) to charge the capacitor 404. During a read operation, the stored charge can be read via BL 408 (e.g., logic low, logic high) and amplified to recover the stored bit value. A plate line (PL) 410 provides a common potential for many cells which can be used to bias the voltage on the BLs during sensing. The plate line potential can be adjusted to change the sensing operation—but only for an ensemble of bits—and changing the bias of the PL does not generally change the amplitude of the signal developed on the BLs. The 1T1C configuration uses a single ended measurement comparing the voltage between the common plate and each individual BL.

A 2T2C memory cell is composed of two transistors 402p, 402n that are coupled to two capacitors 404p, 404n. Similar to operation of a 1T1C memory cell 400, a 2T2C memory cell 450 may include a common WL 406 and a common PL 410; however, unlike a 1T1C memory cell 400, the 2T2C memory cell 450 may include a distinct bit-line (BL) 408 and its complement BLB 412. During operation, the charge of both capacitors 304 are differentially read or written onto BL 408 and BLB 412 and a sense amplifier performs a differential comparison between the voltages on the bit-lines 408, 412.

2T2C memory cells are generally considered to have a higher level of reliability than 1T1C memory cells. This higher level of reliability results from the fact that bits are stored and read as differential values rather than a single ended value. More directly, the PL 410 can correct for some capacitive loading in a 1T1C configuration, but the PL 410 cannot remove all common mode noise introduced by neighboring capacitance. The differential mode operation of 2T2C configuration is immune to common mode noise and provides significantly more signal margin over 1T1C.

Figure 5:
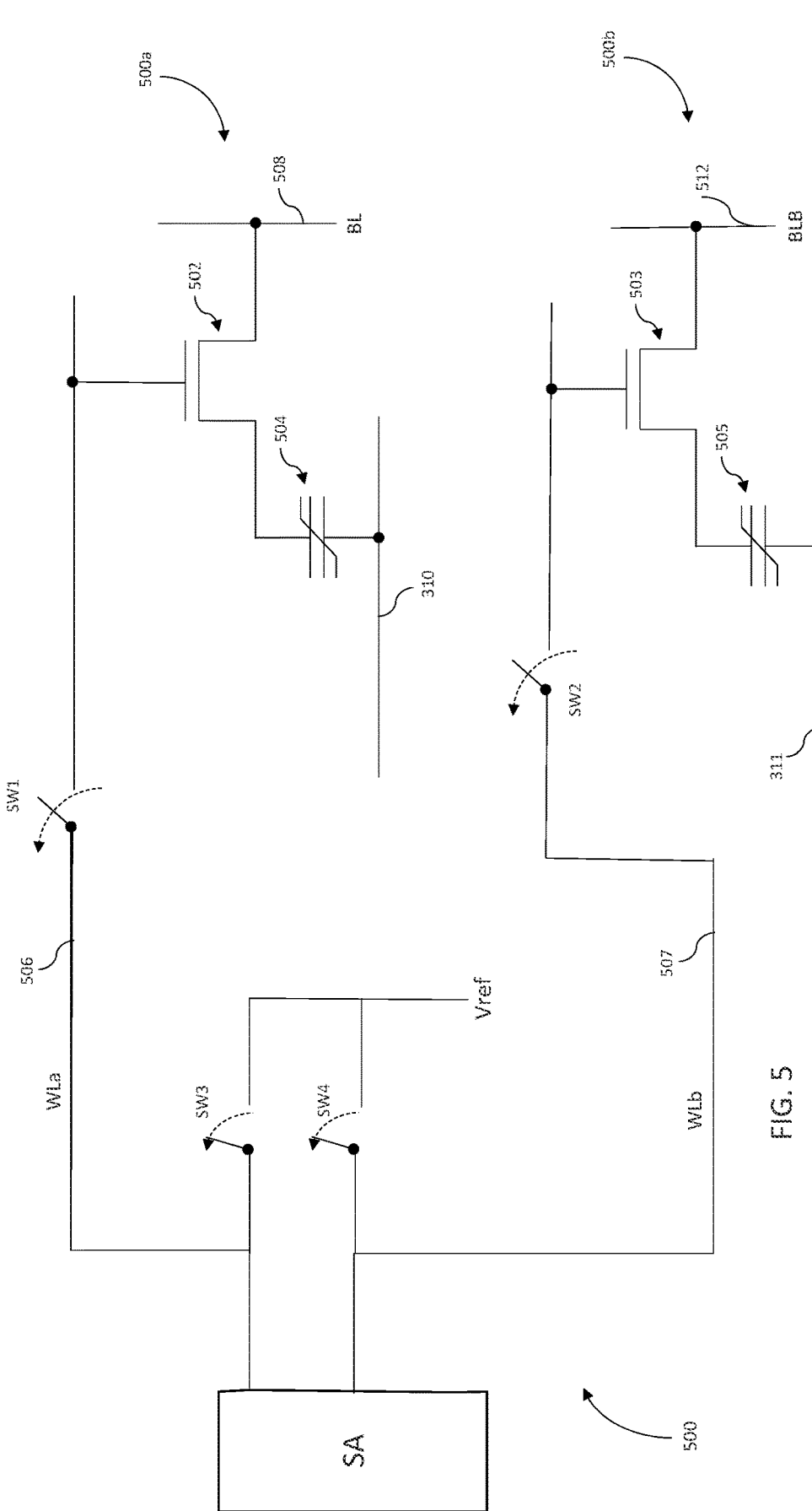
FIG. 5 is a graphical representation of an exemplary memory cell circuitry, in accordance with the principles of the present disclosure.

Referring now to FIG. 5, one exemplary embodiment of the present disclosure enables a memory array to select between single ended and differential mode operations. As shown therein, the illustrated memory cell 500 may be switched to operate as a 1T1C cell or a 2T2C cell.

The exemplary memory cell 500 is composed of two transistors 502/503 that are coupled to respective capacitors 504/505, word lines 506/507, and bit lines 508/512. The memory cell configuration can be folded or unfolded. In the folded configuration, both capacitors 504/505 share a common capacitor plate (i.e., capacitor plate lines 310 and 311 are the same line). In the unfolded configuration, the capacitors do not share a common plate (i.e., capacitor plate lines 310 and 311 are separate lines). A sense amplifier (SA) can switch the memory cell between differential mode and single ended mode. Note that switches SW1/SW2/SW3/SW4 are internal to the circuitry of the SA, but are illustrated outside the SA for clarity.

During 2T2C differential mode, the SA measures two memory sub-cells 500a/500b with opposite charges, and the memory cell 500 is operated just like a normal 2T2C memory cell. The capacitors 504/505 can be charged via word lines 506/507 (in this case, using the same signal). During read operation, the charge of the capacitors 504/505 is differentially read via the bit lines 508/512.

During single ended mode, the SA only writes to one of the memory sub-cells (e.g., memory sub-cell 500a) and holds the other memory sub-cell (e.g., memory sub-cell 500b) at a reference voltage (Vref).

It should be noted by using this configuration, one of the address bits becomes, in effect, a "don't care" bit, but only for a subset of all other memory addresses. Alternatively, certain address combinations become undefined, not allowed, etc. For example, the Table 1 shows a common addressing scheme, where the numbers in brackets indicate bit numbers or bit number ranges. When setting mode register X, RA<14> becomes a "don't care" or 1(0) for a subset of CA<1:9> and for a subset of RA<0:13> and RA<15>, but not for the whole address range. Alternatively, setting this mode register would change RA<14> to "don't care" or 1(0) for all address ranges (i.e., would convert an entire chip or an entire memory array).

TABLE 1

| Row Addressing: |
| --- |
| RA <9:0>, 1 of 1,024 WL's in patch |
| RA <13:10>, 16:1 digit MUX |
| RA <14> 1 of 2 section decode |
| RA <15> P/Q |
| Col Addressing: |
| CA <9:7> 1 of 8 active sections |
| CA <6:4> 1 of 8 CS decode in patch |

A memory array composed of memory cells 500 can store data in 2T2C mode or in 1T1C mode. A 1T1C memory cell may have a lower level of reliability than a 2T2C memory cell. Implementations of the present disclosure enable the ability for memory array to transition between a 2T2C memory cell architecture and a 1T1C memory cell architecture and vice versa. More generally, some memory array architectures may be flexibly designed so as to enable a user to dynamically select between multiple memory cell architectures. Such an implementation may enable increased flexibility for a user of the memory device, while only marginally increasing the footprint for the memory array design (e.g., 0.1%) as compared with a "hardened" memory cell architecture.

While the foregoing example is presented in the context of 1T1C and 2T2C memory cell construction, artisans of ordinary skill in the related arts will readily appreciate that various other memory technologies (e.g., DRAM, FRAM, MRAM, etc.) employ similar memory cell constructions that may be selectively modified for each memory array based on configuration register settings.

Configurable Error Correction Code (ECC) and eFuse—

Error correcting codes (ECC) are often used in memory devices to increase reliability. ECC provides redundancy for memory by storing a small number of parity bits in the memory array with the data. For example, a 128-bit data word may be associated with eight (8) parity bits. These parity bits can be used to detect and correct a single-bit error in the 128-bit word. Whenever data is written to memory, the associated parity bits are updated as well. The DRAM verifies the integrity of the entire 136-bit (128-bit data and its corresponding 8 parity bits) code word when read. If a single bit is detected, the ECC circuitry can correct the error.

ECC parity schemes eliminate most errors but are not perfect; existing memory technologies rarely encounter two single-bit errors in the same code word. Thus, ECC technology provides an effective way to eliminate random single-bit errors under most computing applications.

As used herein, a "code word" is data that complies with a standardized "code" or protocol. A code word is encoded based on a data value and a set of rules. A code word must be decoded to extract the original data value. Generally, the rules ensure that errors in the code word can be detected and/or corrected. Common examples of codes include e.g., Hamming codes, parity codes, cyclic redundancy checks (CRC), Reed-Solomon codes, convolutional codes, 8B10B, 64B/66B, 128B/130B, and/or other schemes well known in the computing arts.

Figure 6:
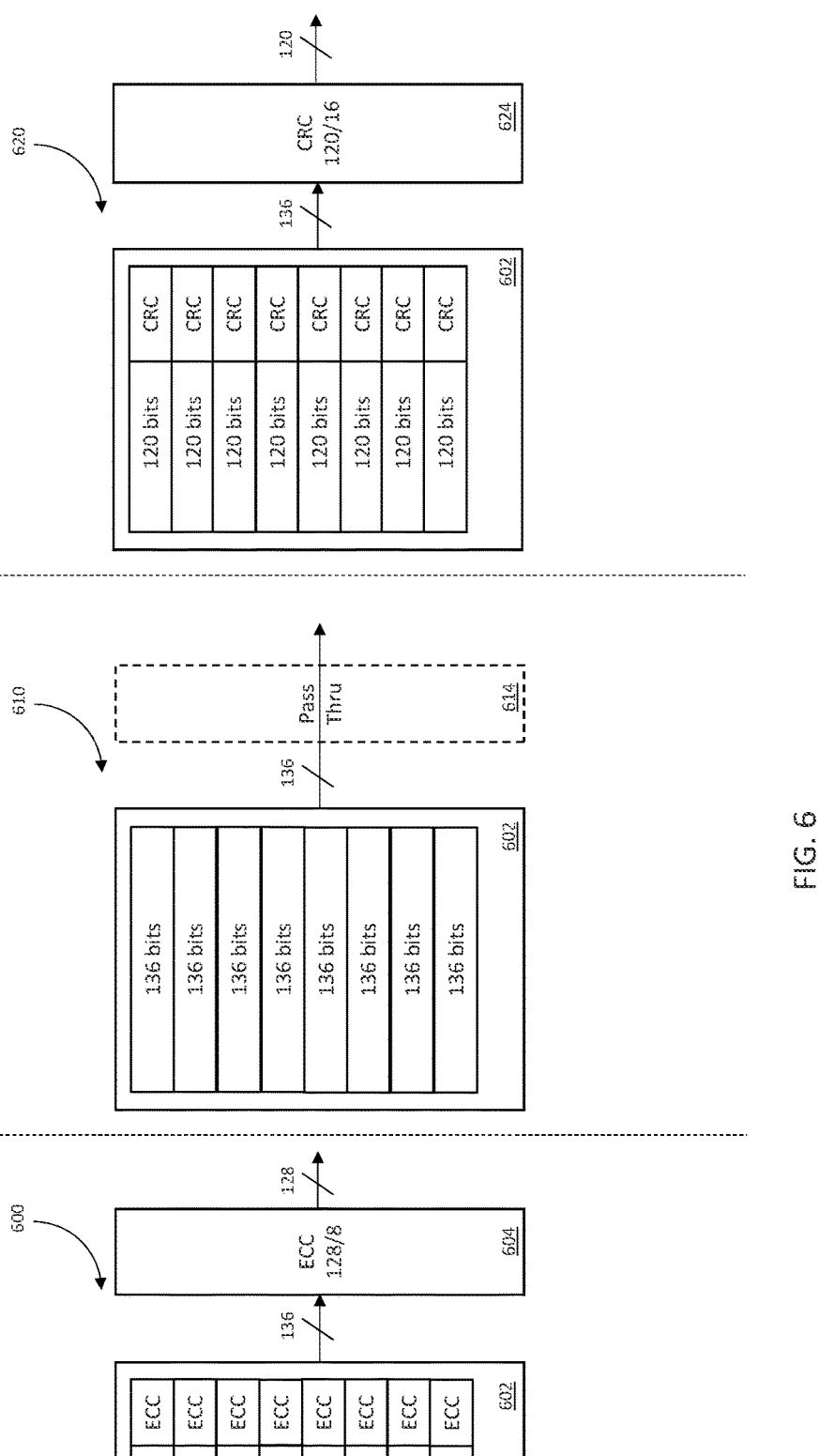
FIG. 6 is a logical block diagram illustrating various architectures for storing data and post-processing data within partitioned memory arrays, in accordance with the principles of the present disclosure.

In one exemplary embodiment, the configuration register (s) may enable, disable, and/or modify ECC memory operation for a memory array. As shown in configuration 600 of FIG. 6, a memory array 602 may implement a 128-bit data word and eight (8) parity bits for ECC 604. During normal operation, a 136-bit code word is read and corrected for single bit errors to recover a 128-bit value. Additionally however, the memory array 602 can be configured according to pass-through operation 610. In pass-through operation, data is read and written as a 136-bit value. In pass-through operation, errors in data can be passed through the ECC module 614 directly (without correction). In still another example, the memory array 602 can be configured according to more stringent operation 620. For example, the memory array may implement higher order CRC codes 624 so as to detect and correct multiple bit errors. This configuration may also be implemented via the addition of an extra e.g., column address bit, in order to avoid remapping address bits normally used for the main array into ECC regions or bit shifting data from the normally addressable part of the array into a currently addressable part of the array.

More generally, artisans of ordinary skill in the related arts will readily appreciate that memory arrays can be (if at all) selectively post-processed using a variety of other coding techniques. For example, other common examples of post-processing may include e.g., line coding (e.g., 8B10B, 64B66B, 128B130B, etc.), hamming codes, parity codes, low density parity check (LDPC), interleaving, and/or any number of other coding techniques.

Another technology that is used in memory arrays to increase reliability is memory cell fuse replacement. For example, a state of the art DRAM device may have anywhere from 128 Megabits (1024×1024×128) to 1 Gigabits (1024×1024×1024) or more of data storage. Each memory bit is made up of a storage cell capacitor and an access device transistor. With such large numbers of bits, there is nearly a 100% chance that any one memory device or chip will have multiple defective bits. To compensate for these defects, redundant bits or redundant memory cells are manufactured into the memory array to logically replace defective bits. For every 1024 rows, there may be two or four additional redundant rows, and for every 1024 columns, there may be four or eight additional redundant columns.

The redundant memory is coupled to fuse banks; each fuse bank may be blown to replace memory locations that are faulty due to e.g., a manufacturing defect. Memories that are manufactured without defects include unblown fuse banks and redundant memory which cannot be accessed; in some cases, this can be a substantial amount of memory (~4%). More directly, redundant memory that is unused consumes precious die space and is "wasted."

Figure 7:
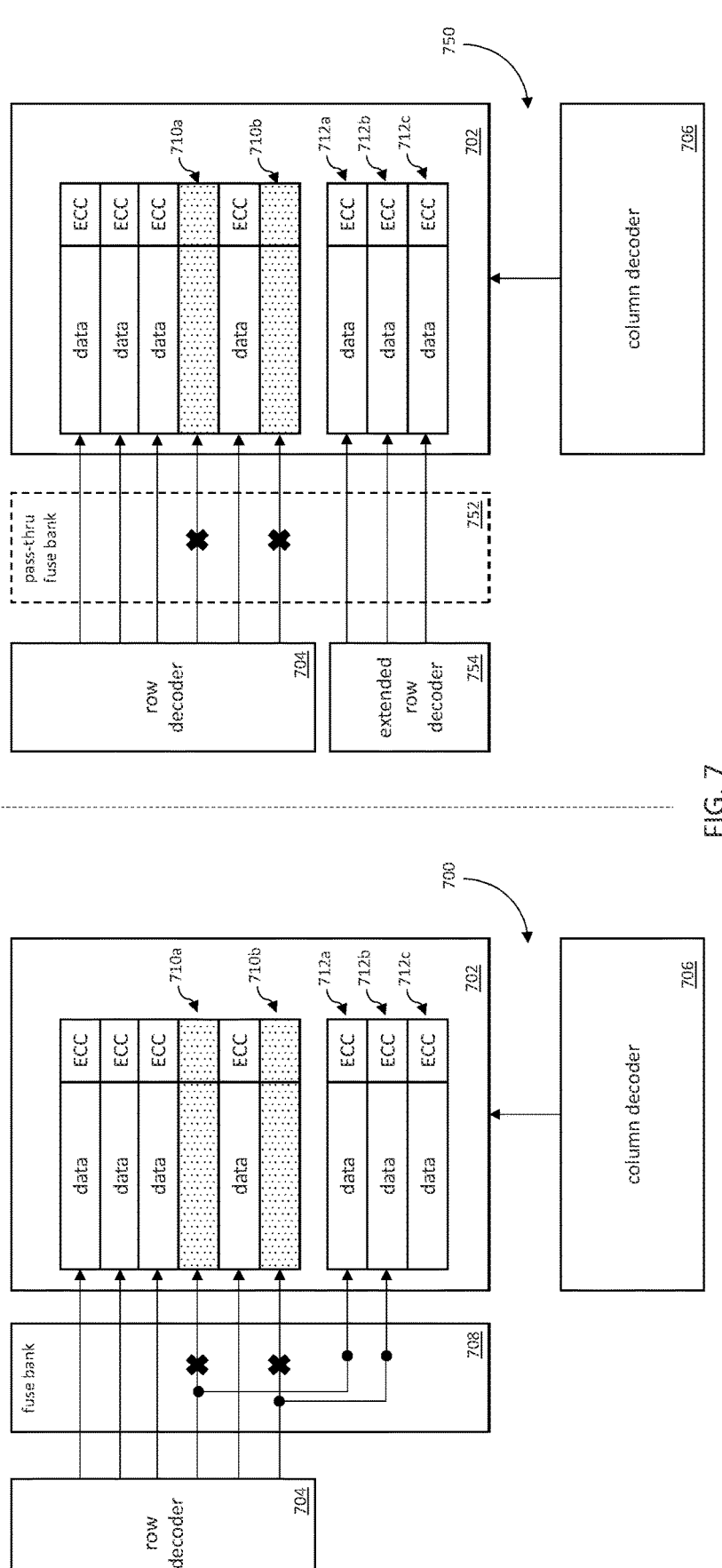
FIG. 7 is a logical block diagram illustrating various architectures for storing data within redundant memory locations of partitioned memory arrays, in accordance with the principles of the present disclosure.

FIG. 7 includes a simplified representation of normal operation 700 and unfused operation 750. Under normal operation 700, a memory array 702 can be accessed via row and column decoders (704, 706). The row decoder 704 is additionally coupled to a fuse bank 708 that can be blown to replace faulty data locations 710 with redundant locations 712. As shown therein, fuse bank operation switches replacement memory locations 712a, 712b in for a faulty memory locations 710a, 712b. However, redundant memory locations are conservatively reserved; e.g., redundant location 712c is not addressable via the row decoder 704.

Unfused operation 750 is similar to normal operation 700; the memory array 702 can still be accessed via row and column decoders (704, 706). However, the row decoder 704 uses a pass-through fuse bank 752. A separate extended range decoder 752 allows memory-mapped IO (MMIO) access to the redundant memory locations 712. As a result, memory faults in the main memory array (710a, 710b) are left uncorrected, and the full range of redundant memory locations (712a, 712b, 712c) can be accessed via the extended row decoder 754 (e.g., as another range of memory within the MMIO).

More generally, artisans of ordinary skill in the related arts will readily appreciate that various forms of redundant memory to improve memory reliability may be selectively enabled, disabled, and/or modified for each memory array based on configuration register settings. Specifically, redundant memory locations can be repurposed to provide additional memory space or to implement other forms of data protections and/or other forms of data coding.

Hybrids and Other Variants—

While the foregoing discussions are presented with regard to modifying e.g., refresh, cell architecture, and/or error processing of a memory array, many memory devices are composed of a plurality of memory arrays. Individual configuration of a plurality of memory arrays within a memory device may enable a user or application to "tailor" operation of the memory device in any number of permutations.

Various embodiments of the present disclosure tailor portions of a memory device in accordance with a designated application (or designated applications). For example, where a user of memory device intends to use at least a portion of the memory device in a video buffering application, the user of memory device may configure an appropriate portion of the memory device to optimize for the video buffering application. In one such implementation, the video data frame size is of a fixed size and useful duration. Video image data for a 1920x1080 24-bit image (also commonly referred to as "1080p") corresponds to a total data size of ~6 MB and has a useful lifetime of ~42 ms (e.g., 24 frames/second). A video buffering application can disable refresh operations for a designated set of memory arrays corresponding to the memory address ranges to accomplish the foregoing performance. Since, the video frame information lifetime is shorter than the refresh cycle rate for a memory array, there is no need to refresh the memory arrays utilized for this particular video buffer application (the data's useful life ends before a refresh cycle is performed). By disabling refresh operations on some memory arrays, these portions of memory may enable higher throughput as compared with a comparable portion of memory in which refresh operations have not been disabled.

However, the video buffering application may require other portions of the memory device to be reliable over longer periods of time. For example, the memory used for long term storage of the video content may have other desirable properties. Accordingly, the video buffering application may configure other memory arrays to regularly refresh and/or utilize ECC. In fact, for very long term storage these memory arrays may be further configured to operate in a 2T2C configuration which e.g., maximizes reliability and minimizes refreshing accesses.

Accordingly, herein lies one salient advantage of the present disclosure over prior memory devices. Namely, the ability for a user or application to tailor various portions of a given memory device in accordance with a desired application (or desired applications) in order to maximize data throughput and/or minimize energy consumption as compared with memory devices that uniformly operate in accordance with a single standardized memory operation.

Various techniques described herein may be used to provide multiple different memory capabilities within the same memory component. In some implementations, a user of memory device may be able to select between two (or more) of these design choices for a given memory array (e.g., refresh rate, ECC memory operation, and/or memory cell architecture may be individually chosen for a given memory array based on, for example, a given application's requirements). These and other variations would be readily apparent to one of ordinary skill given the contents of the present disclosure.

Exemplary Memory Device—

Figure 8:
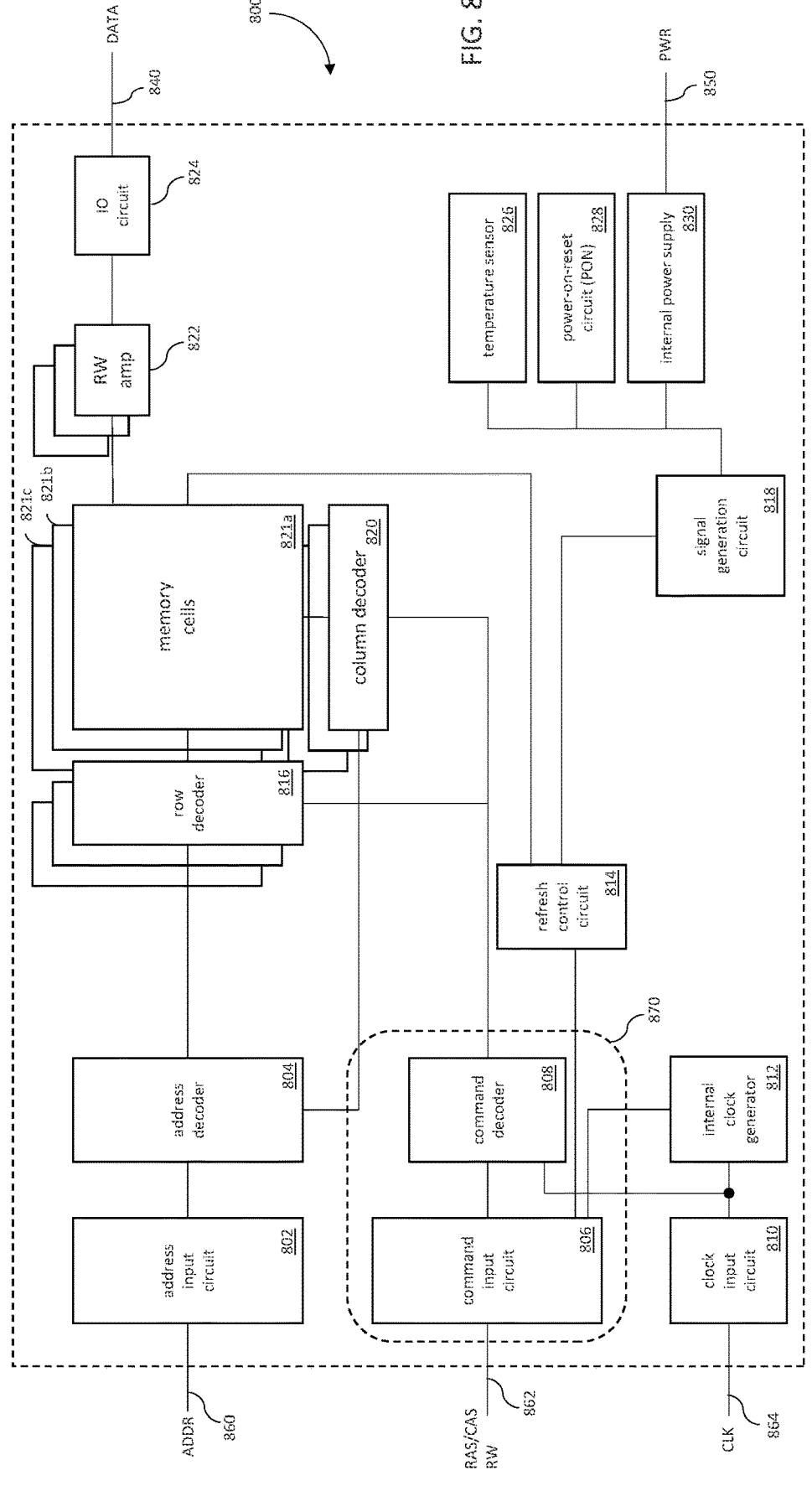
FIG. 8 is a logical block diagram of one exemplary implementation of a memory device manufactured in accordance with the various principles of the present disclosure.

FIG. 8 is a logical block diagram of one exemplary implementation of a memory device 800 manufactured in accordance with the various principles of the present disclosure. The memory device 800 may include a plurality of partitioned memory cell arrays 821. In some implementations, each of the partitioned memory cell arrays 821 may be partitioned at the time of device manufacture. In other implementations, the partitioned memory cell arrays 821 may be partitioned dynamically (i.e., subsequent to the time of device manufacture). The memory cell arrays 821 may each include a plurality of banks, each bank including a plurality of word lines, a plurality of bit lines, and a plurality of memory cells arranged at, for example, intersections of the plurality of word lines and the plurality of bit lines. The selection of the word line may be performed by a row decoder 816 and the selection of the bit line may be performed by a column decoder 820.

The plurality of external terminals included in the semiconductor device 800 may include address terminals 860, command terminals 862, clock terminals 864, data terminals 840 and power supply terminals 850. The address terminals 860 may be supplied with an address signal and a bank address signal. The address signal and the bank address signal supplied to the address terminals 860 are transferred via an address input circuit 802 to an address decoder 804. The address decoder 804 receives, for example, the address signal and supplies a decoded row address signal to the row decoder 816, and a decoded column address signal to the column decoder 820. The address decoder 804 may also receive the bank address signal and supply the bank address signal to the row decoder 816 and the column decoder 820.

The command terminals 862 are supplied with a command signal to a command control circuit 870. The command control circuit 870 may include a command input circuit 806 and a command decoder 808. The command signal 870 may include one or more separate signals such as e.g., row address strobe (RAS), column address strobe (CAS) and/or read/write (R/W). The command signal input to the command terminals 862 is provided to the command decoder 808 via the command input circuit 806. The command decoder 808 may decode the command signal 862 to generate various control signals. For example, the RAS can be asserted to specify the row where data is to be read/written, and the CAS can be asserted to specify where data is to be read/written. In some variants, the R/W command signal determines whether or not the contents of the data terminal 840 are written to memory cells 821, or read therefrom.

During a read operation, the read data may be output externally from the data terminals 840 via a read/write amplifier 824 and an input/output circuit 824. Similarly, when the write command is issued and a row address and a column address are timely supplied with the write command, a write data command may be supplied to the data terminals 840. The write data command may be supplied via the input/output circuit 824 and the read/write amplifier 822 to a given memory cell array 821 and written in the memory cell designated by the row address and the column address. The input/output circuit 824 may include input buffers, in accordance with some implementations.

The clock terminals 864 may be supplied with external clock signals for synchronous operation (commonly used in e.g., Synchronous DRAM (SDRAM). In one variant, the clock signal is a single ended signal; in other variants, the external clock signals may be complementary (differential signaling) to one another and are supplied to a clock input circuit 810. The clock input circuit 810 receives the external clock signals and conditions the clock signal to ensure that the resulting internal clock signal has sufficient amplitude and/or frequency for subsequent locked loop operation. The conditioned internal clock signal is supplied to feedback mechanism (internal clock generator 812) provide a stable clock for internal memory logic. Common examples of internal clock generation logic 812 includes without limitation: digital or analog phase locked loop (PLL), delay locked loop (DLL), and/or frequency locked loop (FLL) operation.

In alternative variants (not shown), the memory 800 may rely on external clocking (i.e., with no internal clock of its own). For example, a phase controlled clock signal may be externally supplied to the input/output (IO) circuit 824. This external clock can be used to clock in written data, and clock out data reads. In such variants, IO circuit 824 provides a clock signal to each of the corresponding logical blocks (e.g., address input circuit 802, address decoder 804, command input circuit 806, command decoder 808, etc.).

The power supply terminals 850 may be supplied with power supply potentials. In some variants (not shown), these power supply potentials may be supplied via the input/output (I/O) circuit 824. In some embodiments, the power supply potentials may be isolated from the I/O circuit 824 so that power supply noise generated by the IO circuit 824 does not propagate to the other circuit blocks. These power supply potentials are conditioned via an internal power supply circuit 830. For example, the internal power supply circuit 830 may generate various internal potentials that e.g., remove noise and/or spurious activity, as well as boost or buck potentials, provided from the power supply potentials. The internal potentials may be used in e.g., the address circuitry (802, 804), the command circuitry (806, 808), the row and column decoders (816, 820), the RW amplifier 822, and/or any various other circuit blocks.

A power-on-reset circuit (PON) 828 provides a power on signal when the internal power supply circuit 830 can sufficiently supply internal voltages for a power-on sequence. A temperature sensor 826 may sense a temperature of the semiconductor device 800 and provides a temperature signal; the temperature of the semiconductor device 800 may affect some operational parameters. For example, refresh rates may need to be adjusted as the temperature of the semiconductor device increases/decreases.

A signal generation circuit 818 may include one or more oscillator(s) that provides an oscillator reference signal based on e.g., the power on signal generated by the power-on-reset circuit (PON) 828 and the temperature provided by the temperature sensor 826. The signal generation circuit 818 may control intervals of oscillator reference signal responsive to the temperature signal (when enabled by the power on signal). For example, the signal generation circuit 818 may decrease the intervals of activation of the oscillator reference signal for more frequent refresh operations when the temperature is higher (e.g., responsive to the temperature signal indicating a higher temperature). The signal generation circuit 818 may also increase the intervals of activation of the oscillator signal for less frequent refresh operations, responsive to the temperature signal indicating that the temperature is lower.

The refresh control circuit 814 provides an internal reference signal for controlling refresh operations. In one embodiment, the refresh control circuit 814 receives the address reference signal from the command decoder 808, the clock enable signal from the command input circuit 806, and the oscillator reference signal from the signal generation circuit 818. For row based refresh, the row decoder 816 may receive the internal reference signal and increment a row address for refresh operations responsive to the internal reference signal. In alternative implementations (where refresh is based on columns rather than rows), the column decoder 820 may receive the internal reference signal and increment a column address for refresh operations responsive to the internal reference signal.

In one exemplary embodiment, various operational parameters associated with various ones of the memory arrays 821 may be controlled via the use of configuration registers. In other words, the use of these configuration registers may enable the tailoring of the memory arrays 821 for a given application (or applications). These configuration registers may further enable the memory cell architectures themselves within the memory arrays to dynamically change. These and other variations would be readily apparent to one of ordinary skill given the contents of the present disclosure.

In one exemplary embodiment, configuration registers can dynamically adjust the refresh control circuit 814 so as to control the rate of refresh for individual ones of the memory arrays 821. For example, the refresh control circuit 814 may disable refresh operations for memory array 821a, may implement a first refresh rate for another memory array 821b, and may implement a second refresh rate (that differs from the first refresh rate) for yet another memory array 821c.

In one exemplary embodiment, configuration registers can dynamically adjust the row decoder 816 and/or corresponding RW amp 822 so as to operate according to e.g., 1T1C or 2T2C operation for individual ones of the memory arrays 821. For example, the row decoder 816 may enable (or disable) an additional row address bit corresponding to single ended (1T1C) or differential mode (2T2C). The additional row address bit doubles the addressable range for the memory array 821. Simultaneously, the corresponding RW amplifier 821 is switched to single ended (1T1C) or differential mode (2T2C). For example, a configuration register can select 1T1C operation for memory array 821a, and may implement 2T2C operation for memory arrays 821b, 821c.

In one exemplary embodiment, configuration registers can dynamically adjust operation of post-processing. For example, memory arrays 821 may enable (or disable) ECC associated with various memory arrays 821. In one such implementations, ECC circuitry may be enabled for memory array 821a, while ECC circuitry may be disabled for memory array 821b. In some cases, post-processing may be further configurable; for instance, rather than using ECC, a memory array 821c may be modified for CRC based correction to provide even higher levels of bit error correction.

In one exemplary embodiment, configuration registers can dynamically adjust operation of row and/or column addressing so as to enable access to redundant memory portions. The row decoders 816 may enable (or disable) access to the redundant fuse bank memories. For example, memory array 821a may have normal fuse bank operation enabled, whereas memory array 821b may be addressable via a pass through fuse bank, leaving a redundant memory array accessible via an extended row address range.

Exemplary Operating System Considerations—

Figure 9:
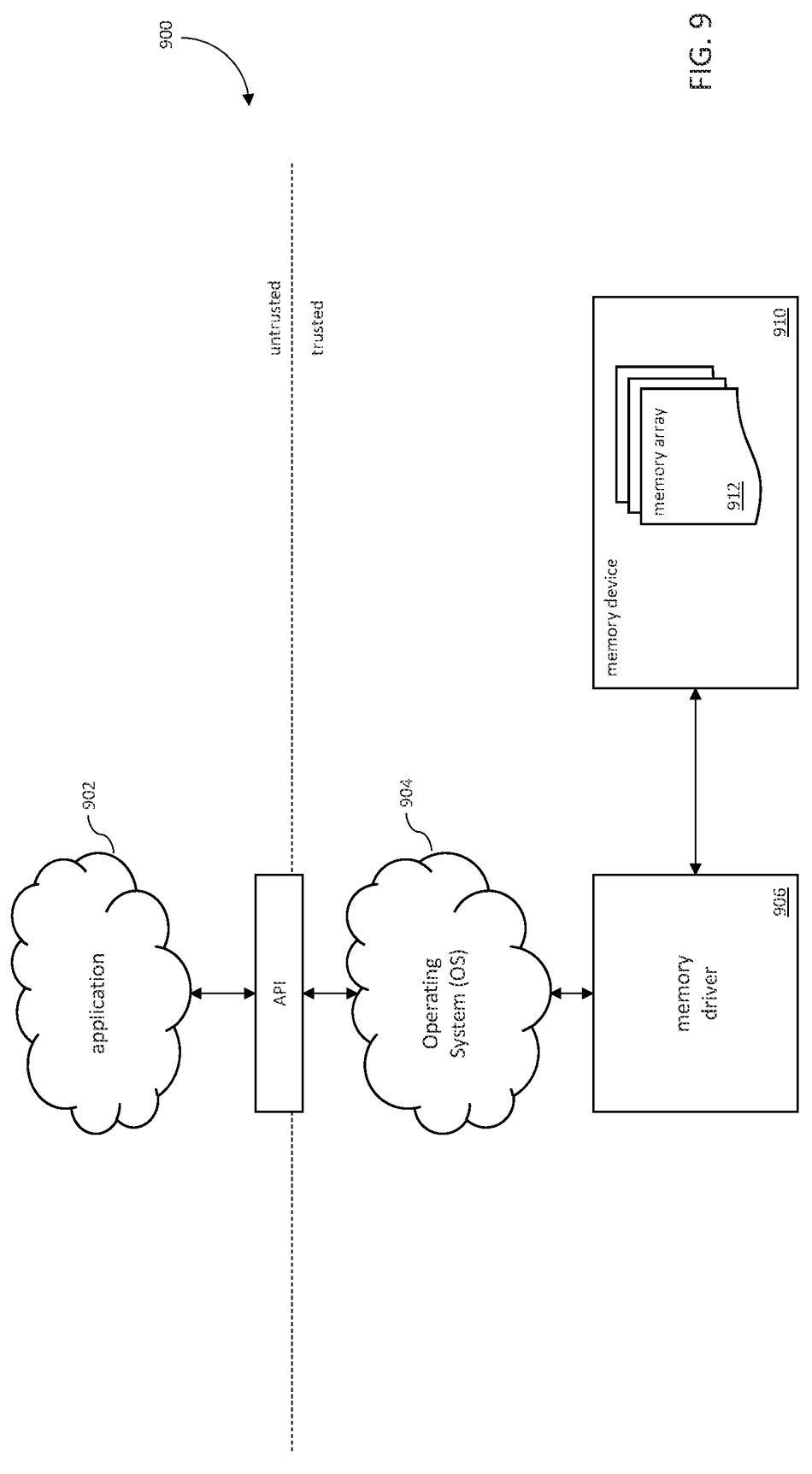
FIG. 9 is a graphical representation of an exemplary computing system configured in accordance with the various principles of the present disclosure.

Referring now to FIG. 9, an exemplary computing system 900 configured in accordance with the various principles of the present disclosure is shown and described in detail. Exemplary computing systems 900 may be used within, for example, desktop computers, laptop computers, tablets, smart devices (e.g., smart phones, smart watches, etc.), or literally any other device capable of executing computer-readable instructions. The computing system 900 functions (or operations) described herein may be implemented in hardware, software, firmware, or combinations of the foregoing. If implemented in software executed by a processor, the functions may be stored on, or transmitted over, as one or more instructions or code on a computer-readable apparatus (e.g., a computer-readable storage medium). Computer-readable media may include both non-transitory computer storage media and communication media including any medium that facilitates transfer of a computer program from one place to another. A non-transitory computer-readable apparatus may include any available medium that can be accessed by, for example, computing system 900.

The computing system 900 may include one or more applications 902. Generally speaking, applications operate within user space which may be considered untrusted. For example, the one or more applications 902 may include a third party application that generally would be untrusted by the computing system 900. Third party applications are software applications that are generated or developed by parties that differ from the developer of the computing system 900. The one or more applications 902 may also include a second party application that may be trusted or untrusted. Second party applications are software applications that are generated or developed by parties that are partially owned, or in otherwise close business relationships with, the developer of the computing system 900. The one or more applications 902 may also include a first party application that may be trusted or untrusted. First party applications are software applications that are generated or developed by the manufacturer or developer of the computing system 900.

As used herein, the terms "privilege", "privileged", "non-privileged", "trust", "trusted" and/or "untrusted" in the context of computing systems refers to the protections implemented by a computer system to protect against faults and/or malicious behaviors. Trusted and/or privileged software may freely access system resources, whereas untrusted and/or non-privileged software may only access system resources under constraints. In some cases, a computer operating system may provide multiple different levels of access to resources. The collection of special interfaces (application programming interfaces (APIs)) between trusted and untrusted software form a trust protocol that allows an untrusted application to access resources in a limited, secure manner. Gating access between trusted and untrusted access can improve security by preventing untrusted programs from misusing resources.

As used herein, the terms "user space" and "kernel space" refer to logical separations in software execution privileges. Processes running within the user space may only access a limited allocation of resources (limited by the kernel), whereas the kernel is trusted with system management and can access any system resource. Most secure computer systems restrict untrusted user space applications from modifying system operation in an unrestricted manner (such as memory operation). For example, within the context of the present disclosure, it would be highly undesirable for a malicious user space application and/or a faulty user space application to modify the configuration of a memory array that is used for a different application.

Referring back to FIG. 9, the one or more applications 902 (which are untrusted) may communicate with trusted software on the computing system 900 via, for example, APIs of an operating system (OS) 904. For example, a socket or interface may be opened which enables the application 902 to communicate with, for example, memory driver 906 of the computing system 900. The OS 904 may provide run-time services for the memory driver 906 and/or the one or more applications 902. Generally, the OS 904 is a trusted software entity that controls access to peripheral components, such as the memory device 910 via a device driver (e.g., memory driver 906).

A device driver is a computer program that operates or controls a particular type of hardware that is attached (or part of) the computing system 900. In the context of the exemplary memory device 910, the device driver is responsible for operating and/or controlling these devices. In one exemplary implementation, the device driver includes a memory driver 906. The memory driver 906 provides an abstraction layer (e.g., translation layer) between, for example, memory device 910 and the application 902 via the OS 904. The illustrated memory driver 906 is trusted, however it is appreciated that some systems may consider the memory driver 906 to be an untrusted application. For example, the memory driver 906 may interface with an external memory device (not shown) via e.g., a network interface or external device interface.

In one exemplary embodiment of the present disclosure, the memory driver 906 provides a memory-mapped input/output (MMIO) interface between the application 902 and the memory device 910. The MMIO is mapped into the same address space as program memory and/or user memory, and is accessed in the same way. MMIO interfaces allow an application 902 to natively access the memory device 910, and manipulate I/O. MMIO interfaces are fully mapped and decoded for every memory device 910; this can correspond to increased hardware complexity and/or dedicated memory controller logic.

In other embodiments of the present disclosure, the memory driver 906 provides a port-mapped input/output (PMIO) interface between the application 902 and the memory device 910. Port mapped I/O uses a separate, dedicated address space and is accessed via a dedicated set of microprocessor instructions. Less dedicated hardware logic is needed to decode a discrete address for PMIO, however address translation is performed in software (which is slower relative to MMIO).

Referring back to FIG. 9, an application 902 (which is assumed to be untrusted) may make a request to, for example, dynamically configure a memory array 912 of the memory device 910 through an application programming interface (API). For example, the request through the API by the application 902 may include a request that a predefined size of memory e.g., does not need to be refreshed, should have a memory cell configuration, and/or may/may not require pre- or post-processing.

In some embodiments, the request is checked to ensure that it complies with the trust protocols of the computer system 900. In other embodiments, the API structurally only accepts requests that comply with trust protocols of the computer system 900. For example, the API may allow the untrusted application 902 to only configure memory that is specifically allocated to itself (the application's isolated resources 902 are also commonly referred to as a "sandbox").

If the request to dynamically configure the memory array 912 of the memory device 910 is allowed by the trust protocols of the computer system 900, then the request is sent to the memory driver 906. The memory driver 906 may then reconfigure the memory arrays 912 and/or associated logic of the memory device 910 to accommodate the request; e.g., the memory arrays 912 e.g., are not refreshed, configured for 1T1C/2T2C, enables/disables ECC, and/or any other operational parameters. In some circumstances, the memory driver 906 may additionally acknowledge to the application 902 and/or the OS 904 that the reconfiguration of the memory device 910 and/or memory arrays 912 has been successful. The memory driver 906 may then service requests from the application 902 in accordance with the successful reconfiguration.

In one embodiment of the present disclosure, the manufacturer of the memory device 910 may specify how to enable reconfiguration of the memory device arrays 912 via various configuration register settings. For example, the manufacturer of the memory device may specify the configuration register settings that enable/disable refresh operations and how to specify the size and/or number of arrays for which the enabling/disabling of refresh operations applies. The manufacturer may additionally specify the rate of refresh and how to specify the size and/or number of arrays for which the rate of refresh applies. Various other configuration register settings may be associated with e.g., memory cell configuration and/or pre- or post-processing configurations.

In one exemplary embodiment of the present disclosure, the manufacturer of the computer system 900 may specify the application programming interfaces (APIs) by which an application 902 can access the memory driver 906. In the illustrated embodiment, the API is an interface to the operating system (OS) 904 of the computer system 900, however other variants may incorporate the memory driver 906 as part of a kernel, Basic Input Output System (BIOS), or other privileged software functionality.

Typically, an API will not provide direct access to the configuration register settings provided by the manufacturer of the memory device 910. Instead, the API may identify configurations that are associated with particular properties and/or particular functionality. For example, the manufacturer of the memory device 910 may provide, for example, various bit error rate (BER) options, memory size options, and/or other performance and reliability trade-offs. In this manner, an application 902 may identify the appropriate properties and/or functionality to the OS 904; the OS 904 configures the memory driver 906, configuration registers, and/or memory device 910 accordingly.

Consider a scenario where an application 902 requests a substantial amount of memory for an error-tolerant video processing application. The API calls a memory reconfiguration function of the OS 904, which provides the appropriate configuration register settings for the memory device 910 and its memory arrays 912. For instance, the memory driver 906 may reduce a refresh rate for the specified size and/or number of arrays because the video application data is used faster than the default refreshing intervals. Additionally, the memory driver 906 may configure the memory cells to operate in 1T1C operation rather than 2T2C operation, thereby providing much higher memory capacity within the same memory array. Finally, the memory driver 906 may disable ECC and/or fuse bank operation, relying on the error-tolerant video processing software for error recovery. This and other variations would be readily apparent to one of ordinary skill given the contents of the present disclosure.

It is appreciated that a memory device 910 has a finite number of memory arrays 912; for example, a memory device 910 with three (3) distinct memory arrays 912 can only support up to three different memory configurations. As a result, in some implementations, the memory driver 906 may determine whether or not a given reconfiguration request will be granted (or implemented). As part of the determination, the memory driver 906 may consider whether a given reconfiguration request can be accommodated in view of the current memory arrays that are currently in use. Notably, reconfiguring a memory array may require that the contents of the entire memory array are either copied, lost, or flushed; for example, converting a 1T1C memory array to 2T2C operation requires that all of the memory contents are re-written from differential values to single-ended values. Moreover, converting from 2T2C operation to 1T1C operation may be lossy (2T2C operation can only hold half the memory contents of an 1T1C memory array).

In some embodiments, if a given reconfiguration request is in conflict with other memory array usage, the memory driver 906 may not implement the reconfiguration request and may notify the OS 904 and/or the application 902 that the request was unsuccessful. In other embodiments, if a given reconfiguration request is in conflict with other memory array usage, the memory driver 906 may attempt to consolidate different memory array functionality into the "least common denominator" of acceptable parameters. For example, an error-tolerant application may share memory arrays with an error-intolerant application; the error-tolerant application is less stringent in its operational parameters and is not adversely affected by higher reliability.

In still other embodiments, the decision of whether or not to implement a given reconfiguration request may be made based on a prioritization scheme. For example, trusted applications may be given a higher level of priority than untrusted applications. In other examples, the OS 904 may prioritize between requests made from a user interface application (which is perceptible to the user) and a request made by a background daemon (which is imperceptible to the user). More generally, the OS 904 may make decisions on reconfiguration requests based on levels of priority for the applications 902 that make the requests. For example, application A may have a higher level of priority than application B. Application B may have a higher level of priority than application C, while application C may have a higher level of priority than application D. Accordingly, OS 904 may implement (or not implement) reconfiguration requests based on this established level of hierarchy. Once the OS 904 has selected the appropriate memory configurations, the OS 904 can instruct the memory driver 906 to configure or re-configure the memory device 910 accordingly.

It will be appreciated that while the foregoing exemplary computing system 900 is described in terms of a substantially dynamic system, other approaches (including static or "hardened" and quasi-dynamic may be utilized consistent with the present disclosure. Specifically, in one such embodiment, the system would be configured at design to have address ranges with different properties to balance the need for high reliability versus more capacity. Any applications would accordingly be configured to work within that system.

As an aside, the cost of using a dynamic configuration such as described supra may include extra circuitry or components needed (e.g., to be built into the memory controller), thus at least partly offsetting cost savings achieved via utilization of the configuration described herein generally. As such, the present disclosure further contemplates hybrid or quasi-dynamic systems which can utilize advantageous or desired attributes of both types of configurations (e.g., hardened and dynamic), and/or use such components selectively. For instance, only certain aspects of the dynamic operation described above may be employed, thereby reducing modifications/additions to the controller logic.

Methods

Methods of using or operating the aforementioned memory device architecture will now be further described herein.

Figure 10:
FIG. 10 is a logical flow diagram of an exemplary method for operating a memory device in accordance with the various principles of the present disclosure.

Referring now to FIG. 10, a logical flow diagram of an exemplary method 1000 for operating a memory device in accordance with implemented configurations is shown and described in detail.

At operation 1002, one or more configuration requests for configuring the memory device are received. In one exemplary embodiment, the one or more configuration requests are received by an operating system (OS) operating in a privileged or trusted kernel space. In one variant, the one or more configuration requests are generated by a user space application. In some such variants, configuration requests may be application programming interface (API) calls made by an untrusted or non-privileged user space application.

In some cases, the user space application can query the OS (or memory driver) regarding memory performance options, and thereafter select an option for use based on its own application specific considerations. In other variants, the user space application may notify the OS regarding its memory performance preferences and rely on the OS (or memory driver) to intelligently handle memory management based on a variety of system wide considerations (which may include requirements of other user space applications, ongoing kernel space tasks, etc.).

In some variants, the user space application can generate configuration requests with a corresponding priority and/or a minimum acceptable performance. For example, the user space application may indicate that error-free operation is a lower priority relative to performance. Additionally, the user space application may indicate that performance down to e.g., $1 \times 10^{10}$ bit error rate (BER) is acceptable, however a minimum access latency is required. For reasons described in greater detail hereinafter, the user space application's request may be granted contingent on a variety of other system considerations. Thus, identifying importance and/or performance constraints can significantly improve the likelihood that a configuration request is granted. In other words, the application may significantly benefit from providing as much information as possible.

In other variants, the user space application can generate configuration requests that identify specific configuration register values. Still other methods of identifying requested performance may be substituted by artisans of ordinary skill in the related arts given the content of the present disclosure.

In some embodiments, the computer system may not implement a trusted/untrusted application space division. For example, some devices (such as an Internet of Things (IoT) device) may be sufficiently fixed in operation, uncomplicated, and/or otherwise constrained in a manner where trusted/untrusted application spaces are not required for security and/or fault tolerance. In such implementations, the one or more configuration requests may be directly received by a memory driver.

While the illustrated embodiment illustrates a user space initiated configuration request, alternative embodiments may enable an operating system (OS) to initiate configuration/reconfiguration without being requested by e.g., a user space application. In such implementations, an OS may dynamically manage memory configurations based on current application loads and/or system configurations. For example, an OS that determines that more memory is required to service its current application load may proactively switch a memory arrays of a memory device from 2T2C to 1T1C type operation (thereby doubling capacity of the memory array). In another such example, an OS that determines that a user space application has historically stored and used data from the same memory locations on time scales shorter than the standard refresh interval may configure the memory to refresh less often.

A variety of operational parameters for a memory device may be configured. In some implementations, the one or more operational parameters may be dynamically adjusted during operation without affecting the memory contents. In other implementations, the one or more operational parameters may only be adjusted prior to memory use (because adjustment during memory use may result in unacceptable data loss). However it should be noted that in some cases, dynamic adjustment (even if lossy) may be preferable to non-adjustment. For example, adjusting a memory to handle a high priority kernel space tasks may be prioritized over lower priority user space tasks, and may cause a user space task to be "flushed".

Common examples of operational parameters associated with memory arrays include without limitation: e.g., refresh rates, memory cell architecture, error correction, addressing modes, etc. For example, a configuration requests may include a request to turn on/turn off refresh for one or more arrays of the memory device. As but another non-limiting example, a configuration requests may include, for example, a request to alter (or establish) a refresh rate for one or more arrays of the memory device. A configuration requests may include, for example, a request to disable (or enable) ECC operation for one or more arrays of the memory device. A configuration requests may also include, for example, a request to alter the memory cell architecture for one or more arrays of the memory device. For example, a request to alter the memory cell architecture may include a request to alter a 1T1C memory cell architecture to a 2T2C memory cell architecture, or vice versa.

Operational parameters associated with various other memory logic and/or components include without limitation: e.g., clocking rates, power consumption, voltage levels, set-up/hold times, etc. For example, a configuration requests may include a request to reduce power consumption and/or increase clock rates for the memory. Various other aspects of memory operation may be modified so as to achieve other desirable performances, such as is discussed in greater detail in e.g., U.S. patent application Ser. No. 16/276,461 filed Feb. 14, 2019 and entitled "Methods and Apparatus for Characterizing Memory Devices," Ser. No. 16/276,471 filed Feb. 14 2019 entitled "Methods and Apparatus for Checking the Results of Characterized Memory Searches," and Ser. No. 16/276,489 filed Feb. 14, 2019 and entitled "Methods and Apparatus for Maintaining Characterized Memory Devices," each of the foregoing incorporated herein by reference in its entirety. For example, various memory arrays of the present disclosure may accept lower reliability for higher performance, in accordance with a "solution density function" described therein.

At operation 1004, a decision on whether or not to grant the one or more received configuration requests is made. Generally, any physical memory device can only support a finite number of permutations of different operational parameters. However, a physical memory device may be shared by many software applications because software applications are "virtual" and may potentially be quite numerous.

In an illustrative embodiment, a memory device with a finite number (N) of memory arrays may at most support up to N different memory configurations. In more sophisticated embodiments, a memory device may be able to sub-section a memory array so as to provide a greater amount of flexibility. In other embodiments, some memory configurations may necessarily limit other memory configurations; for example, changes to a memory cell architecture to double the memory size of one memory array may affect available bandwidth for refreshes of other memory arrays, etc. As a result, a memory device with N of memory arrays may support fewer than N memory configurations.

A typical computer system may run an operating system (OS) that supports hundreds of different software applications. For example, a modern cellular device may run a multi-threaded OS (each thread corresponding to a separate kernel space application) that supports a population of user space applications, each of which may also be multi-threaded (each thread corresponding to a separate user space application). Artisans of ordinary skill in the related arts will readily appreciate that enterprise server devices may support substantially more numerous applications, and dedicated use devices (e.g., Internet of Things (IoT)) may support fewer, the foregoing being purely illustrative.

In one exemplary embodiment of the present disclosure, each software application could potentially request a different memory configuration, thus the operating system (OS) determines when a configuration request should be accommodated and/or when a configuration request should be denied. In other embodiments, an application or a memory driver determines configuration request should be accommodated or denied.

In one exemplary embodiment, an operating system (OS) may determine whether or not a received request can be granted/denied based on a rule. For example, a rule may deny requests from applications with a lower priority than the applications with currently granted memory configurations. In some implementations, the OS may have access to a listing of priorities for a given number of applications. Accordingly, the decision to grant (or deny) may be based on the listing of priorities and/or may be based on whether or not a given request conflicts with another request that has already been granted/received. In other implementations, these rules or priorities may be explicitly set or inferred from a user of a computing system. For example, a user interface may identify a particular user space application in the foreground that should be prioritized over other applications (e.g., background daemons, etc.)

As used herein, a "rule" refers to a predefined instruction that executes one or more actions when one or more conditions are met. Multiple rules may be concurrently and/or sequentially active so as to enable a wide range of operations. In some cases, rules and/or priorities can be statically set. For example, certain fixed use devices may have pre-set rules and/or pre-set priorities. In other cases, rules and/or priorities may be dynamically set. In another example, multi-use devices may dynamically switch between rule sets and/or priority settings. More generally, any number of algorithms and/or heuristics may be used to determine whether or not a request should be granted/denied.

Common examples of system considerations that may be considered in rules may include, without limitation, e.g., resource usage (e.g., processing burden, memory usage, power consumption, etc.), performance considerations (bandwidth, latency, throughput, performance, etc.), user space and/or kernel space application considerations (error tolerance/intolerance, quality of service, historic usage, priority), external considerations (peer devices, network limitations, network bandwidth, network congestion, etc.), and/or any number of other factors commonly associated with device performance.

In one exemplary embodiment, determining whether or not a configuration request can be granted is based on a current usage of one or more memory arrays of a memory device. As previously noted, a memory device with a finite number (N) of memory arrays may at most support up to N different memory configurations. Since most applications may arbitrarily be initiated and/or terminated at different points in time, various ones of the memory arrays may be in use at any point in time. During normal operation, configuration requests are likely to be received while all the memory arrays are currently in use, thus various aspects of the present disclosure further contemplate servicing requests within existing allocations and/or pruning existing allocations.

Consider a memory device that includes a set of two (2) memory arrays for the memory device. Initially, a first application that has a highest level of priority requests and is granted a memory array that is not refreshed to enable higher performance. A second application that has an intermediate level of priority requests and is granted a memory array that is refreshed at a standard refresh rate for error-free operation. Subsequently thereafter, a third application that has a lowest level of priority requests a reduced refresh rate. In this example, the first and second applications keep their memory array allocations due to their higher priority. Depending on the nature of the third application's request, the third application's request may be denied or consolidated in an existing allocation. If the third application's request can be met (without conflict) by the configured memory arrays associated with either the first or second requests than the third application's request may be consolidated therein. On the other hand, if the third application requested reduced refresh operation as an optimization for error-tolerant operation, then it may be serviced in the same memory array as either the first application or second application. In contrast, if the third application requested reduced refresh operation so as to enable higher performance, then it can only be serviced (if at all) with the first memory array.

It is further noted that over time, the operating system (OS) and/or application may change request priorities. For example, the OS may increase priorities of requests that are denied and re-submitted based on e.g., a wait time. For instance, as described supra, if the third application's request is denied, the third application may re-submit at a later time with a higher priority. The OS may determine at that time that the third application priority has risen above e.g., the second application's priority. Under this circumstance the OS may instruct the memory driver to re-configure the memory array consistent with the third application's request and consolidate the second application's allocation therein.

As a related variant, the operating system (OS) and/or application may prune memory array allocations pre-emptively in preparation for future requests. For example, the OS may determine that second application's memory array configuration has sufficiently aged and can be released. Rather than waiting for another request (or for the second application to release the memory allocation) the OS may pre-emptively free the second application's current memory allocation. By pre-emptively pruning memory array allocations, the OS can immediately respond to a future request.

These and other examples would be readily apparent to one of ordinary skill given the contents of the present disclosure. The foregoing example is merely intended to illustrate the principles of the present disclosure.

At operation 1006, the one or more configurations are implemented in the memory device. In one exemplary embodiment, the implementation of the configuration in the memory device is managed by the memory driver in accordance with instructions from the OS and/or a user space application. In other embodiments, the implementation of the configuration in the memory device is managed solely by the memory driver.

For example, if the OS decides that the one or more configuration requests should be granted, the OS may instruct the memory driver to configure one or more memory arrays of the memory device in accordance with the granted configuration requests. In some implementations, implementing a configuration request may be caused by the memory driver writing to one or more configuration registers located within, for example, the memory device. Accordingly, the memory device alters its operation in accordance with the values located within these configuration registers. These values may include, for example, a value that disables (or enables) refresh operations for one or more of the memory arrays of the memory device, a value that is sets a refresh rate for one or more of the memory arrays of the memory device, a value that enables (or disables) ECC circuitry and/or other pre- or post-processing within one or more of the memory arrays of the memory device, and/or a value that changes the memory cell architecture for one or more of the memory arrays of the memory device.

In some embodiments, implementing the memory configuration further requires that some memory arrays are consolidated, pruned, or otherwise manipulated within the existing memory array allocations. In one such variant, one or more sections of a memory array be consolidated within another memory array. For example, consolidation includes moving data from sections of one memory array to another memory array (i.e., a copy-delete operation). In some variants, consolidation may be lossy; i.e., some portions of data may not be copied. In other variants, consolidation may be lossless. In another such example, pruning includes deleting data from a memory array. Modifications to memory contents may also be required. For example, consolidating a memory arrays with different types of pre- or post-processing (e.g., CRC, ECC, LDPC, etc.) may require that data is read from one array, converted, and re-written to another array.

In some embodiments, if a different set of features were granted than requested, then the memory driver and/or OS may notify the user space application. This information may be useful to prevent unexpected and/or wasteful operation. For example, a user space application that requests but cannot obtain fewer refreshes for improved memory bandwidth may be able to throttle down its performance to deal with the lower than requested memory bandwidth. Similarly, a user space application that requests but cannot obtain a memory cell change (e.g., from 2T2C1 to T1C) may need to adjust its memory footprint size and/or reliability expectations. Additionally, the OS may consider historic grant and/or denial information in subsequent prioritization for re-submitted requests. For example, re-submissions may be allocated higher priority where previous requests were denied or consolidated with other grants. In other examples, re-submissions may be allocated lower priority where previous requests that were denied or consolidated were still sufficient.

Figure 10A:
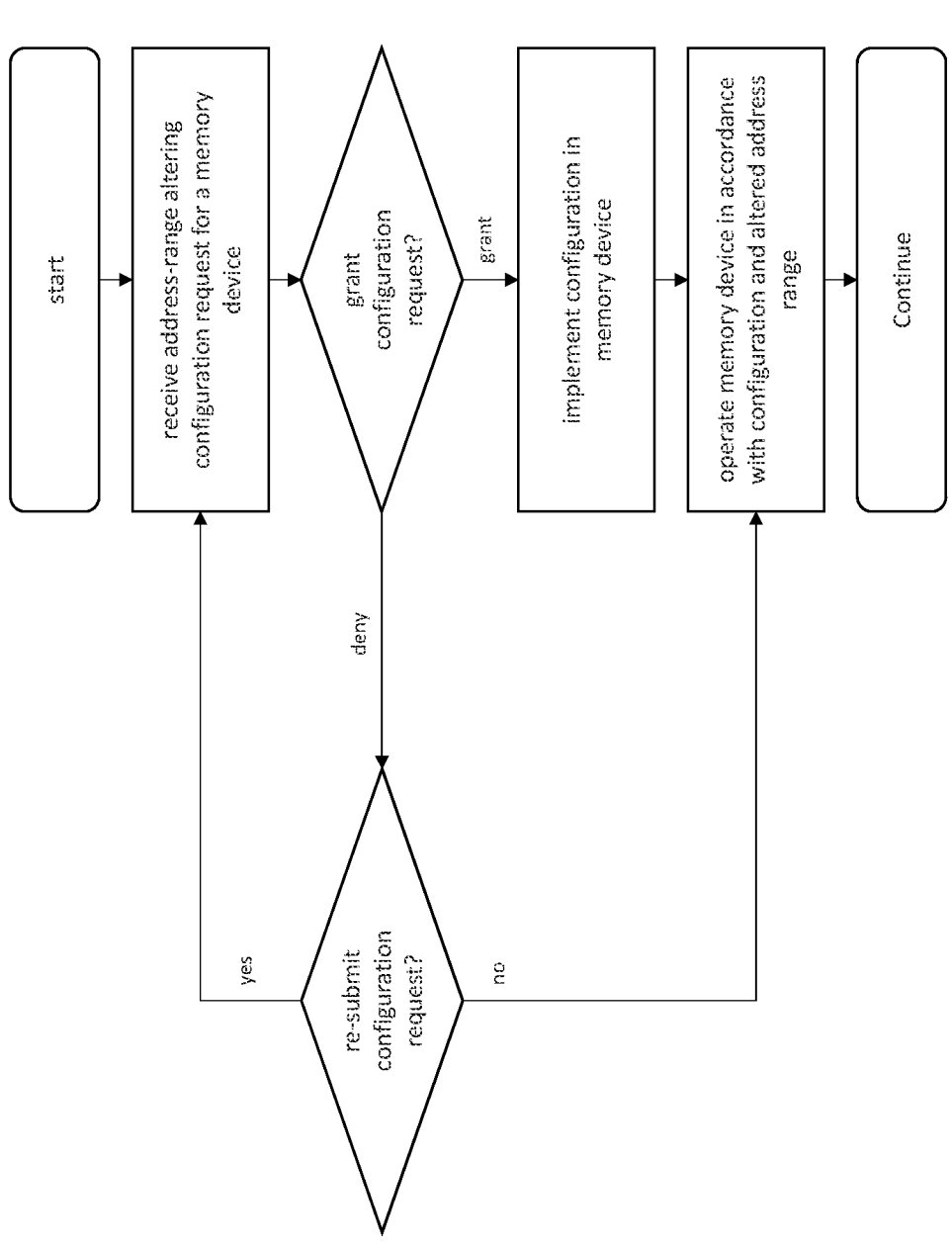
FIG. 10*a* is a logical flow diagram of another exemplary method for operating a memory device in accordance with the various principles of the present disclosure.

In one embodiment (see FIG. 10A), implementing the one or more of the configurations (or configuration changes) in the memory device as described elsewhere herein will vary the accessible storage on the device. For example, in one such scenario, an increase in the storage accessible on the memory device is produced as a result of inclusion or removal of one or more functions via the configuration (change). For instance, if a request to disable ECC operation for one or more arrays of the memory device is implemented, the amount of storage available to an application or user in those memory arrays is increased by virtue of a lesser number of cells or portions of the array being considered unusable for ostensibly failing ECC. This change to the available storage capacity is reflected by a change in the addressable space of the memory device. In other words, a memory device having a first address range X would now respond to a second, larger address range Y once the configuration change was implemented. The second address range may include the first address range X, plus one or more additional addressable bits added to encompass the newly accessible cells/portions. In various implementations, the present disclosure contemplates: (i) addition of one or more bits at the MSB portion of the address; (ii) addition of one or more bits at the LSB portion of the address; and/or (iii) addition of one or more bits within the address, such as at prescribed range boundaries or other suitable locations. Similarly, if an operation to enable ECC operation is implemented, the amount of available/addressable memory decreases.

These and other examples would be readily apparent to one of ordinary skill given the contents of the present disclosure. The foregoing examples are merely intended to illustrate the principles of the present disclosure.

Referring back to FIG. 10, a configuration request for a memory space may be partially denied and partially granted; for example, a memory space may be allocated even though the configuration request for the memory space is denied. Alternatively, a memory space that cannot be configured is a complete failure (i.e., no memory space is allocated for the request if the request cannot be granted).

When a configuration requests is denied at step 1008, the requesting application may determine whether or not to re-submit the request at a later time (return to step 1002), or use the memory (continue to step 1010). For example, a memory space could be allocated within a memory array that is configured with a higher priority configuration; thus, even though the configuration request is denied, the memory allocation may still be used "as is".

In one embodiment, an application that has made one or more configuration requests that was denied, may alter (or not alter) its operation in accordance with properties of its memory allocation. Similar to that which was described supra, where none of the requested features were granted, then the memory driver and/or OS may notify the user space application of the memory properties that were allocated so as to prevent unexpected and/or wasteful operation. For example, a user space application that requests but cannot obtain improved memory bandwidth may be able to throttle down its performance to deal with the lower than requested memory bandwidth. In other examples, a user space application may gracefully terminate its request (relinquishing any memory allocation) and re-submit at a later time.

In some implementations, the denial of a configuration request is not communicated to the application that made the one or more configuration requests. Such implementations may be necessary to preserve security and/or prevent malicious behavior. As such, the application may operate in accordance with its existing design specifications and the OS and/or memory driver may service the application in a manner that hides the underlying memory operation from the user space application.

These and other variations would be readily apparent to one of ordinary skill given the contents of the present disclosure, the foregoing examples merely being exemplary.

At operation 1010, the memory device is operated in accordance with its implemented configuration(s). In particular the memory device can be operated in accordance with the granted configuration requests in order to, inter alia, optimize performance for various ones of the applications.

In dynamically configurable embodiments, the exemplary method 1000 for operating a memory device in accordance with implemented configurations may then return to operation 1002 where, for example, the operating system (OS)

may receive additional configuration requests for the memory device. Specific operating examples are now described.

First Example Operation

A volatile memory device may be optimized for use in video buffering applications. As previously noted, video frame information stored in the memory device may have an expected lifetime of usefulness. For example, a developer of a video buffering application may disable refresh operations for a video buffering portion of the memory device so as to enable, inter alia, increased memory throughput and decreased power consumption for the memory device. Specifically, the video buffering application includes computer-executable code that requests refresh mechanisms be disabled for a video buffering memory allocation. The video buffering portion of the memory device is configured to store and provide frames of video information within a video frame interval (e.g., —42 ms).

During exemplary operation, the volatile memory cells of the memory device are not refreshed and the frames of video information are stored and consumed within the video frame interval. In other words, the video frame data is not held long enough for refresh to matter; the volatile memory device only needs to refresh data that is held longer than 60 ms. Video frame data may be allowed to dissipate until new information may be written to the memory device. In this manner, the refresh overhead for the video buffering portion of the memory device and the power required to implement refresh operations may be minimized. Such an implementation may be particularly desirable for resource constrained devices. For example, in the context of portable computing devices (e.g., laptops, smart phones, etc.), the power consumed by the portable computing device may be reduced, thereby enabling longer battery life and an improved user experience for users of the portable computing device. This enabled longer battery life may increase the desirability of the portable computing device for consumers.

As but one other non-limiting example, consider a usage scenario where a viewer of content may only wish to view a portion of available visual content. In other words, a user may only desire to look into a given extent of space (e.g., a viewport) within, for example, a 360° extent of panoramic space. In such an application, the entire extent of panoramic space for a given frame may be loaded into memory for subsequent viewing; however, only a limited subset of this loaded memory may actually be viewed. In the context of a video application, the unviewed content loaded into memory may be considered stale if not refreshed.

As a brief aside, reading volatile data requires that the stored electrical charge is resolved to a logical level. Thus, reading data provides an implicit refresh of the data value. Accordingly, viewport data that is being viewed (read) may be stored into memory arrays that are not refreshed. Non-viewport data which is not being regularly read must be refreshed. In some cases however, only video information that is presented for viewing by a user is important; other portions of the stored video information (i.e., the non-viewport data) are not used by a user and can have very high error rates.

More directly, the entire 360° extent of panoramic space can be stored within volatile memory without refresh. The viewed portions of the panoramic space are implicitly refreshed by virtue of being read and decoded into video frames. The non-viewed portions of the panoramic space are unused and can be ignored.

In this manner, the memory device may be operated in a way that reduces refresh overhead thereby increasing memory throughput. Moreover, the power requirements for the memory device may also be decreased as compared with a memory device in which refresh operations are enabled. Again, such an implementation may be particularly desirable for resource constrained devices. In other words, in the context of portable computing devices (e.g., laptops, smart phones, etc.), the power consumed by the portable computing device may be reduced, thereby enabling longer battery life and an improved user experience for users of the portable computing device. As previously discussed above, this enabled longer battery life may increase the desirability of the portable computing device for consumers.

Second Example Operation

In addition to the aforementioned video buffering applications, the same or similar principles may be readily applied to other sorts of applications in which the data stored on the memory device may otherwise have a limited amount of useful duration. For example, the determined application may include an Internet of Things (IoT) application. Some of the considerations that may need to be weighed with a given IoT application are cost, size, power consumption and/or startup time. For example, some IoT applications may either run on small batteries or are otherwise energy limited (e.g., may be powered using so-called energy harvesting). Moreover, some of the data generated (or consumed) in an IoT application may be considered "critical", while other data generated (or consumed) may be considered "non-critical". Accordingly, some of the memory arrays may be configured to handle the critical data, while other memory arrays may be configured to handle the non-critical data.

As but one non-limiting example, the memory arrays for handling the critical data may be refreshed, while the memory arrays for the non-critical data may not be refreshed (or refreshed less frequently). Various gradations of intermediately critical data may be refreshed more frequently than the non-critical data and less frequently than the critical data. Moreover, the memory arrays for handling the critical data may enable ECC functionality for the memory device, while handling of the non-critical data may disable ECC functionality for the memory device. The aforementioned considerations may enable the IoT application to consume less power, and/or may increase memory throughput for the memory device.

In some implementations, the IoT application may determine the memory requirements for its current (or expected) volume of memory access activity. For example, in situations in which its current (or expected) volume of memory access activity is low, the memory device may disable, for example, refresh operations for one or more of its memory arrays. Subsequently, the IoT application may determine that more memory resources may be needed and accordingly, refresh operations for one or more of its memory arrays may be enabled. In other words, the memory device may alter its capabilities and/or requirements dependent upon the anticipated requirements of the application.

For example, consider an application for a wildlife (game or trail) camera. The application may be required to capture low resolution infrared video (heat images) in order to detect the presence of wildlife. However, the camera may take a single (or relatively few) high resolution snapshots when wildlife is present. Accordingly, the camera application may disable refresh for portions of its volatile memory arrays during infrared operation, in order to conserve power. The camera application may enable refresh for its volatile memory arrays to take high resolution images when wildlife is present. Once the high resolution snapshot is captured, it can be stored for long term storage in a non-volatile memory (e.g., a flash memory) and the camera can return to low resolution infrared video operation.

These and other examples for flexible configuration of a memory device would be readily apparent to one of ordinary skill given the contents of the present disclosure.

Third Example Operation

Figure 11:
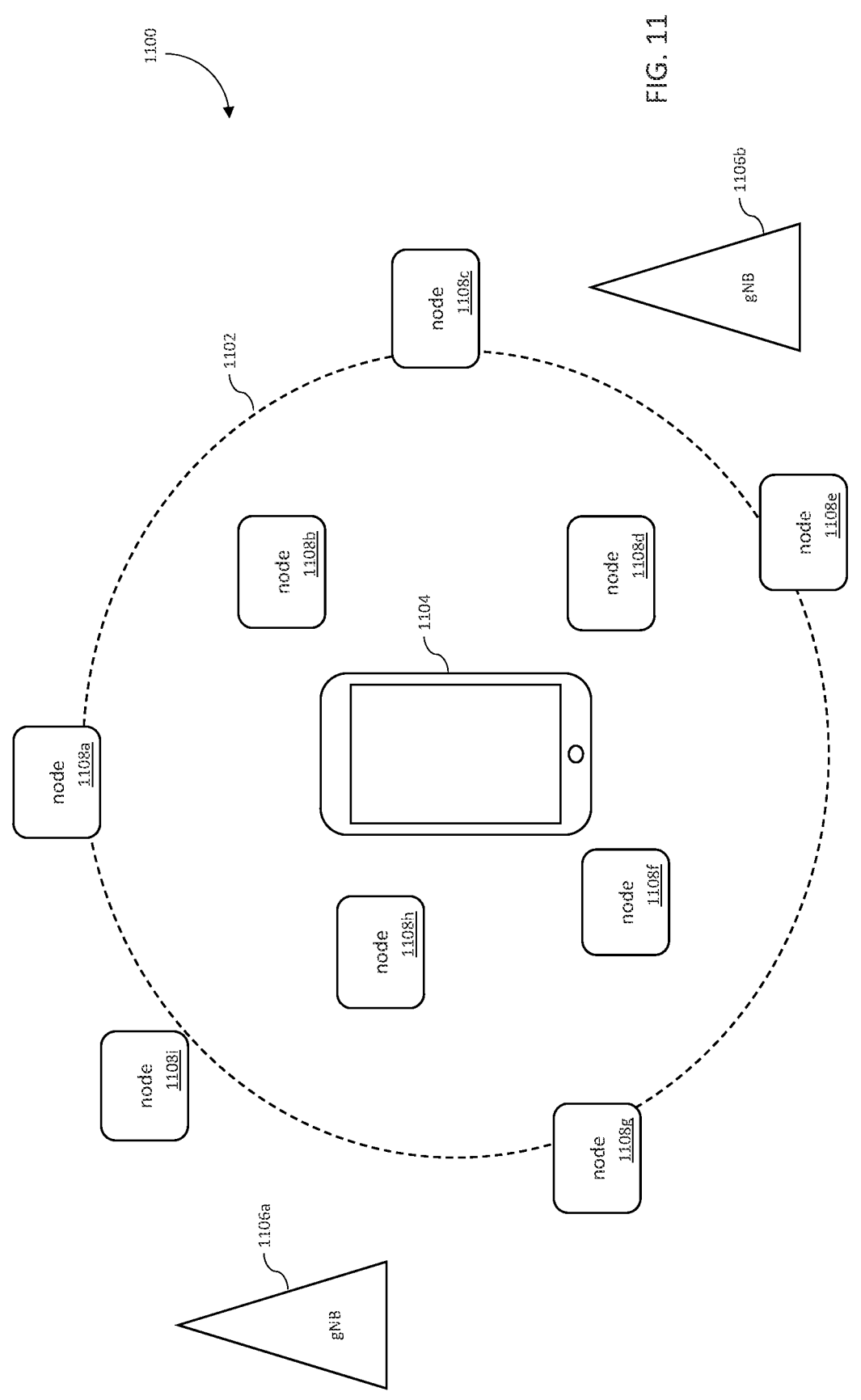
FIG. 11 is a graphical representation of an exemplary computing system in a fog computing or fog networking application, in accordance with the various principles of the present disclosure.

Referring now to FIG. 11, an exemplary system 1100 for use in a fog computing or fog networking application is shown and described in detail. As a brief aside, fog computing or fog networking is an architecture that uses a collaborative multitude of end-user clients (e.g., nodes 1108) to carry out a substantial amount of storage, communication and management. Fog-like architectures may be fully distributed, mostly centralized or somewhere in-between. However, regardless of specific architecture, fog networks generally distribute the resources and services of computation, communication, control, and storage closer to systems at or near the users of the fog network. For example, and as illustrated in FIG. 11, a user device 1104 may need to communicate data with one or more base stations 1106a, 1106b. This data may be transmitted from the user device 1104 to the base stations 1106a, 1106b, or may be received from the base stations 1106a, 1106b at the user device 1104. However, direct communication may not be possible as the base stations 1106a, 1106b may reside outside of the communication area 1102 of the user device 1104. Accordingly, a number of intermediary communication nodes 1108 may be required in order to facilitate this communication between the user device 1104 and the base stations 1106a, 1106b.

A consequence of such a distributed architecture is that the user device 1104 may need to keep track of the nodes 1108 within its coverage area 1102. However, the user device 1104 and/or the intermediary nodes 1108 may be in constant movement. As a result, various nodes 1108 may be entering and/or exiting the coverage area 102 for the user device. The user device 1104 and the nodes 1108 may be power constrained. For example, the user device 1104 may be dependent upon a limited power source (e.g., batteries, solar power, etc.). As such, it may be important for the user device 1104 and/or the nodes 1108 to operate in an as power efficient manner as possible. The user device 1104 and/or the nodes 1108 may include a variety of electronic devices such as smart phones, tablets, wearable devices or literally any other power constrained computing devices. In some implementations, the user device 1104 and the nodes 1108 may take a similar form (e.g., they may all constitute smart phones). The user device 1104 (and/or nodes 1108) may each include a memory device that is utilized in order to keep track of its surrounding intermediate nodes 1108.

As but one non-limiting example, the user device 1104 may store the location of nodes 1108 that are in closer proximity to the user device 1108 in a higher reliability area of the memory device (e.g., an area of the memory device that is refreshed). For example, nodes 1108b, 1108d, 1108f, 1108h may be stored the higher reliability area of the memory device. However, the user device 1104 may store the location of nodes 1108 that are at the farther edges of the user device 1104 coverage area 1102 in a lower reliability area of the memory device (e.g., an area of the memory device that is not refreshed, or refreshed at a rate that is lower than that of the higher reliability area of memory). For example, nodes 1108a, 1108c, 1108e, 1108g, 1108i may be stored in a lower reliability area of the memory device.

The more distant nodes 1108 may be kept in a lower reliability area of memory as these more distant nodes may be expected to exit (and enter) the user device coverage area 1102 more frequently and hence may be less important for communications between the user device 1104 and base stations 1106a, 1106b. Conversely, the closer proximity nodes 1108 may be expected to reside within the user device coverage area 1102 for a longer period of time and may provide more useful for the purposes of communications between the user device 1104 and base stations 1106a, 1106b. Accordingly, the user device 1104 that operates in accordance with this schema may consume less power as compared with a user device in which its memory device operates with standard refresh. These and other variations would be readily apparent to one of ordinary skill given the contents of the present disclosure, with the foregoing example merely being exemplary.

It will be recognized that while certain aspects of the disclosure are described in terms of a specific sequence of steps of a method, these descriptions are only illustrative of the broader methods of the disclosure, and may be modified as required by the particular application. Certain steps may be rendered unnecessary or optional under certain circumstances. Additionally, certain steps or functionality may be added to the disclosed embodiments, or the order of performance of two or more steps permuted. All such variations are considered to be encompassed within the disclosure disclosed and claimed herein.

While the above detailed description has shown, described, and pointed out novel features of the disclosure as applied to various embodiments, it will be understood that various omissions, substitutions, and changes in the form and details of the device or process illustrated may be made by those skilled in the art without departing from the disclosure. This description is in no way meant to be limiting, but rather should be taken as illustrative of the general principles of the disclosure. The scope of the disclosure should be determined with reference to the claims.

What is claimed is:

1. A non-transitory computer readable storage medium having stored thereon computer-readable instructions, the computer-readable instructions configured to, upon execution by a processing apparatus of a computerized apparatus, cause the computerized apparatus to:

receive, from an untrusted application via one or more application programming interfaces of an operating system, data representative of one or more configuration requests to configure one or more memory arrays of a memory device;

implement the one or more configuration requests.

2. The computer readable apparatus of claim 1, wherein the untrusted application comprises an application generated or developed by a party different from a developer of the computer-readable instructions.

3. The computer readable apparatus of claim 2, wherein the computer-readable instructions are further configured to, upon execution by the processing apparatus of the computerized apparatus, cause the computerized apparatus to:

utilize the one or more application programming interfaces to perform one or more checks on the one or more configuration requests from the untrusted application, the one or more checks configured to determine whether the one or more configuration requests comply with one or more trust protocols of the computerized apparatus.

4. The computer readable apparatus of claim 1, wherein:

the receipt of the one or more configuration requests comprises receipt of one or more configuration requests from an application for a prescribed amount of memory of the one or more memory arrays for a video processing application; and the implementation of the one or more configuration requests comprises disablement of at least one of:

an error-correcting code; or a fuse bank operation, based on a reliance on video processing software of the video processing application for error recovery.

5. The computer readable apparatus of claim 1, wherein:

the receipt of the one or more configuration requests comprises receipt of one or more configuration requests from an application for a prescribed amount of memory of the one or more memory arrays for a video processing application; and the implementation of the one or more configuration requests comprises causation of a memory driver of the computerized apparatus to configure memory cells of the one or more memory arrays to convert from a two-transistor two-capacitor operation to a one-transistor one-capacitor operation, thereby increasing memory capacity within the one or more memory arrays.

6. The computer readable apparatus of claim 1, wherein:

the receipt of the one or more configuration requests comprises receipt of one or more configuration requests from an application for a prescribed amount of memory of the one or more memory arrays for a video processing application; and the implementation of the one or more configuration requests comprises causation of a memory driver of the computerized apparatus to reduce a refresh rate for a least one of:

specified size; or a number of arrays based on a determination that video application data is used faster than default refreshing intervals.

7. The computer readable apparatus of claim 1, wherein the computer-readable instructions are further configured to, upon execution by the processing apparatus of the computerized apparatus, cause the computerized apparatus to:

determine, based on a prioritization scheme, whether to implement the one or more configuration requests.

8. The computer readable apparatus of claim 7, wherein:

the data representative of the one or more configuration requests comprises data representative of at least one request from at least one trusted application and data representative of at least one request from at least one entrusted application, wherein the at least one trusted application comprises an application generated or developed by a same party that developed the computer-readable instructions; and the determination, based on the prioritization scheme, whether to implement the one or more configuration requests comprises a determination to implement the least one request from the at least one trusted application based on the least one request from the at least one trusted application having a higher priority than the at least one request from the at least one entrusted application.

9. A computing device comprising:

a processing apparatus;

a memory device integrated within the computing device and in communication with the processing apparatus; and a computer readable apparatus comprising a non-transitory storage medium having stored thereon computer-readable instructions, the computer-readable instructions configured to, upon execution by the processing apparatus, cause the computing device to:

determine whether to change a configuration of the memory device based on at least one configuration request from a user space application; and implement the change to the configuration of the memory device.

10. The computing device of claim 9, wherein the determination of whether to change the configuration of the memory device comprises a determination that a change to the configuration of the memory device is needed based on at least one of:

a current application load; or one or more system configurations.

11. The computing device of claim 10, wherein:

the determination that the change to the configuration of the memory device is needed based on the at least one of:

the current application load; or the one or more system configurations comprises a determination that additional memory is required to service a current application load; and the implementation of the change to the configuration of the memory device comprises causation of a switch of one or more memory arrays of the memory device from a two-transistor two-capacitor operation to a one-transistor one-capacitor operation, thereby increasing capacity of the one or more memory arrays.

12. The computing device of claim 9, wherein the computer-readable instructions are configured to, upon execution by the processing apparatus, cause the computing device to:

receive data representative of at least one configuration request from a user space application; and wherein the determination of whether to change the configuration of the memory device comprises a determination of whether to grant the at least one configuration request based on a current usage of one or more memory arrays of the memory device.

13. The computing device of claim 9, wherein the computer-readable instructions are configured to, upon execution by the processing apparatus, cause the computing device to:

receive data representative of at least one configuration request from a user space application, the at least one configuration request associated with a first priority level;

based on the determination whether to change the configuration of the memory device, cause a denial of the at least one configuration request;

based on the denial, receive data representative of a re-submission of the at least one configuration request; and based on the re-submission of the at least one configuration request, change the at least one configuration request from the first priority level to a second priority level, the second priority level being a higher priority level than the first priority level.

14. The computing device of claim 9, wherein the computer-readable instructions are configured to, upon execution by the processing apparatus, cause the computing device to:

receive data representative of at least two configuration requests;

wherein:

the determination of whether to change the configuration of the memory device comprises a determination of whether to grant the at least two configuration requests; and the determination of whether to grant the at least two configuration requests comprises a determination of whether one of the at least two configuration requests conflicts with another one of the at least two configuration requests.

15. The computing device of claim 9, wherein the implementation of the change to the configuration of the memory device comprises comprise disablement of an error-correcting code function of the memory device.

16. A method for operating a memory device, comprising:

receiving data representative of one or more configuration requests for the memory device;

determining whether to grant the one or more configuration requests for the memory device based on a determination that an allocation of at least one memory array of the memory device to an application can be released;

based at least on the determining, implementing the one or more configuration requests within the memory device; and causing operation of the memory device in accordance with the implementing.

17. The method of claim 16, wherein the receiving of the data representative of the one or more configuration requests comprises receiving data representative of at least two requests; and the method further comprises:

determining whether to implement individual ones of the at least two requests based on a priority scheme.

18. The method of claim 17, wherein the determining of whether to implement the individual ones of the at least two requests based on the priority scheme comprises prioritizing implementation of one of the at least two requests received from a user interface application over one of the at least two requests received from a background daemon.

19. The method of claim 16, further comprising:

determining that an allocation of at least one memory array of the memory device to a application can be released;

based on the determining that the allocation of the at least one memory array of the memory device to the application can be released, pre-emptively freeing the at least one memory array of the memory device prior to receiving one or more subsequent requests for memory allocation.

20. The method of claim 16, wherein the receiving of the data representative of the one or more configuration requests for the memory device comprises receiving of the data representative of two or more configuration requests; and the method further comprises:

determining that respective grants of at least two of the two or more configuration requests can be consolidated.

* * * * *